(12) United States Patent
Chen et al.

(10) Patent No.: US 7,773,680 B2
(45) Date of Patent: Aug. 10, 2010

(54) SYSTEM AND METHOD FOR PROVIDING 3-DIMENSIONAL JOINT INTERLEAVER AND CIRCULATION TRANSMISSIONS

(75) Inventors: Jeng-Hong Chen, Temple City, CA (US); Pansop Kim, Los Angeles, CA (US)

(73) Assignee: ISSC Technologies Corp., Hsinchu (TW)

( * ) Notice: Subject to any disclaimer, the term of this patent is extended or adjusted under 35 U.S.C. 154(b) by 1201 days.

(21) Appl. No.: 11/254,359

(22) Filed: Oct. 20, 2005

(65) Prior Publication Data

US 2006/0088115 A1   Apr. 27, 2006

Related U.S. Application Data

(60) Provisional application No. 60/620,724, filed on Oct. 22, 2004.

(51) Int. Cl.
*H04K 1/10* (2006.01)
(52) U.S. Cl. ...................................................... 375/260

(58) Field of Classification Search .................. 375/260; 370/208; 714/701, 755
See application file for complete search history.

(56) References Cited

U.S. PATENT DOCUMENTS

| 7,535,819 B1 * | 5/2009 | Larsson et al. ............... 370/208 |
| 2003/0105996 A1 * | 6/2003 | Dagan et al. ................. 714/701 |
| 2004/0117711 A1 * | 6/2004 | Farbert et al. ................ 714/755 |

* cited by examiner

*Primary Examiner*—David C Payne
*Assistant Examiner*—Leon-Viet Q Nguyen
(74) *Attorney, Agent, or Firm*—Alston & Bird LLP

(57) ABSTRACT

System performance in wireless communication is improved by increasing diversity in time, space and frequency. Information to be transmitted is processed by a convolution encoder to produce encoded bits. The encoded bits are interleaved and mapped to subcarriers. Symbols are created from the subcarriers and the symbols are transmitted so as to increase diversity in time, space and frequency. Circulation transmission in addition to interleaving is used to increase diversity. For example, circulation transmission can be symbol based or subcarrier based.

14 Claims, 28 Drawing Sheets

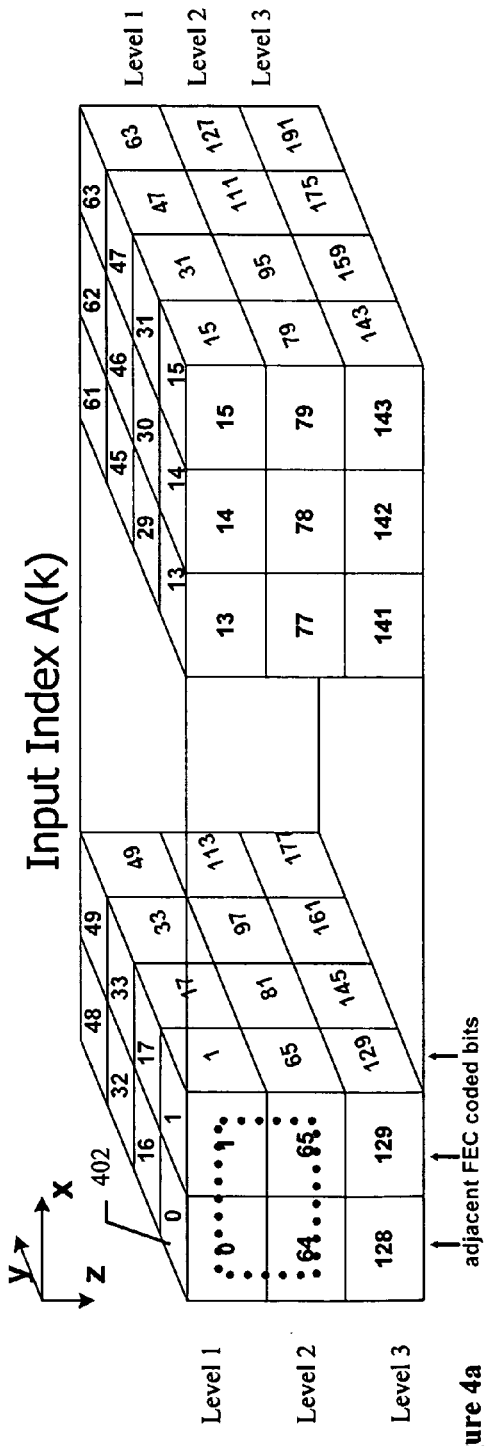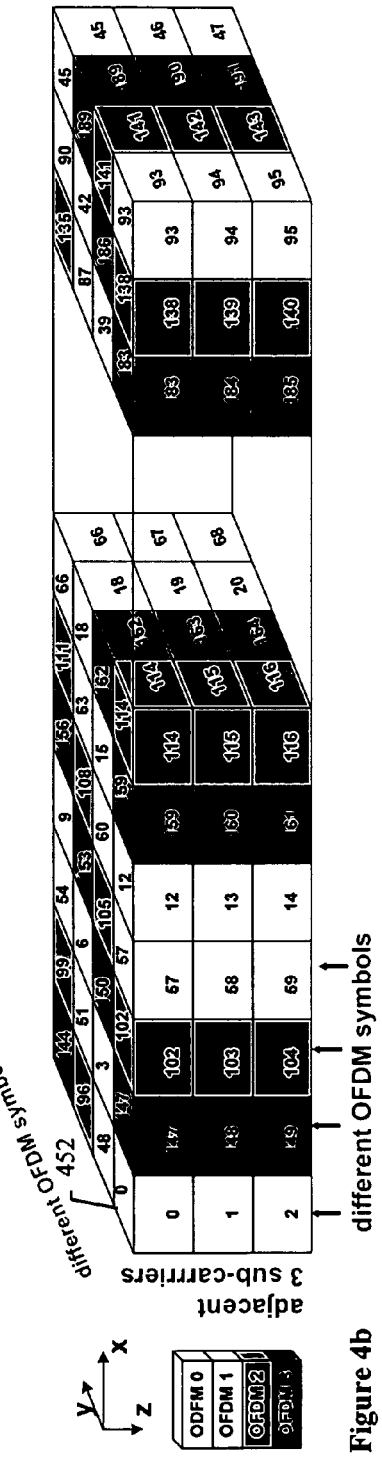
Figure 4a
Figure 4b

Figure 5a: Input Index A(k)

Figure 5b: Output Index B(j)

Figure 6a

Input Index A(k)

Figure 6b

Output Index B(j)

Input Index A(k)

Output Index B(j)

$N_{SC}$ (subcarriers) = $N_{SCPC} \times N_{column}$
$N_{CBPS}$ (bits) = $N_{row} \times N_{column}$ $N_{SCPC} = N_{row}/N_{BPSC}$

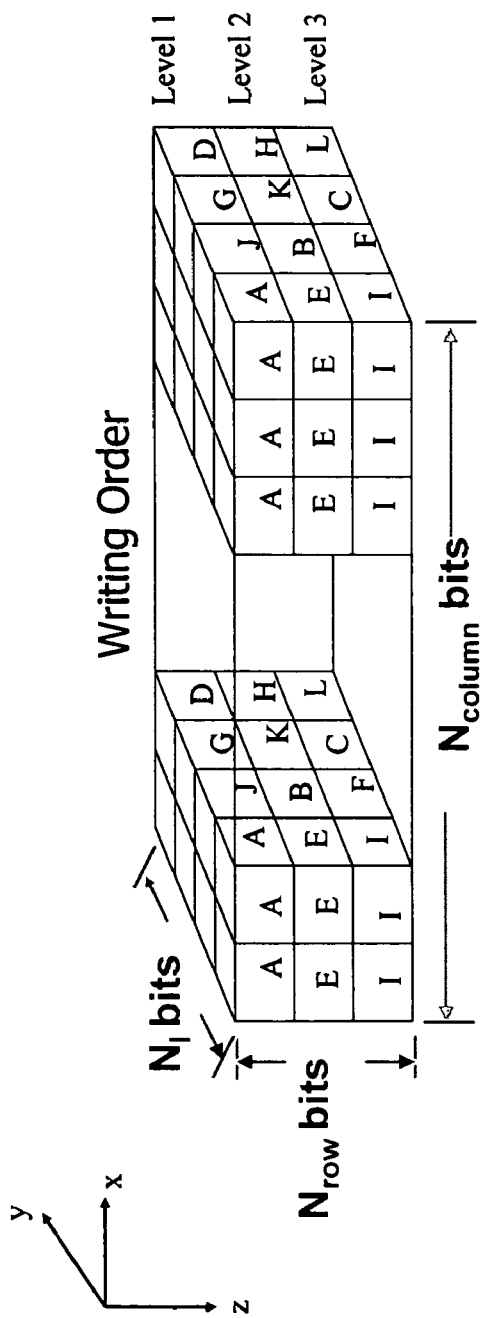
Figure 10a
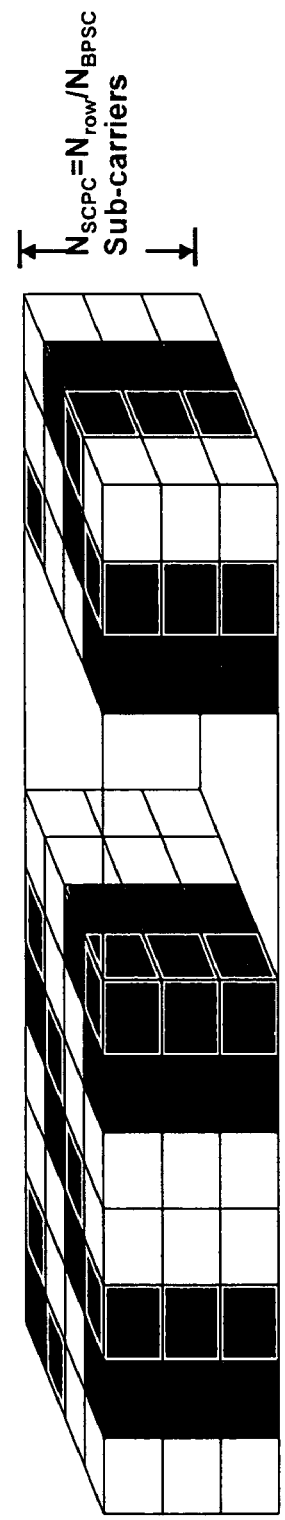
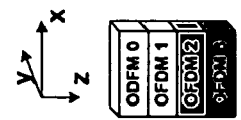
Figure 10b

Figure 11a

|  | | Interleaver 3D | | | | | Interleaver 3D-A | | | |
|---|---|---|---|---|---|---|---|---|---|---|
| Subcarrier # | OFDM | #0 | #1 | #2 | #3 | OFDM | #0 | #1 | #2 | #3 |
| SC #0 | | 0 | 16 | 32 | 48 | | 0 | 144 | 96 | 48 |
| SC #1 | | 64 | 80 | 96 | 112 | | 64 | 16 | 160 | 112 |
| SC #2 | | 128 | 144 | 160 | 176 | | 128 | 80 | 32 | 176 |
| SC #3 | | 17 | 33 | 49 | 1 | | 145 | 97 | 49 | 1 |
| SC #4 | | 81 | 97 | 113 | 65 | | 17 | 161 | 113 | 65 |
| SC #5 | | 145 | 161 | 177 | 129 | | 81 | 33 | 177 | 129 |
| SC #6 | | 34 | 50 | 2 | 18 | | 98 | 50 | 2 | 146 |
| SC #7 | | 98 | 114 | 66 | 82 | | 162 | 114 | 66 | 18 |
| SC #8 | | 162 | 178 | 130 | 146 | | 34 | 178 | 130 | 82 |
| SC #9 | | 51 | 3 | 19 | 35 | | 51 | 3 | 147 | 99 |
| SC #10 | | 115 | 67 | 83 | 99 | | 115 | 67 | 19 | 163 |
| SC #11 | | 179 | 131 | 147 | 163 | | 179 | 131 | 83 | 35 |
| SC #12 | | 4 | 20 | 36 | 52 | | 4 | 148 | 100 | 52 |
| SC #13 | | 68 | 84 | 100 | 116 | | 68 | 20 | 164 | 116 |
| SC #14 | | 132 | 148 | 164 | 180 | | 132 | 84 | 36 | 180 |
| SC #15 | | 21 | 37 | 53 | 5 | | 149 | 101 | 53 | 5 |
| SC #16 | | 85 | 101 | 117 | 69 | | 21 | 165 | 117 | 69 |
| SC #17 | | 149 | 165 | 181 | 133 | | 85 | 37 | 181 | 133 |
| SC #18 | | 38 | 54 | 6 | 22 | | 102 | 54 | 6 | 150 |
| SC #19 | | 102 | 118 | 70 | 86 | | 166 | 118 | 70 | 22 |
| SC #20 | | 166 | 182 | 134 | 150 | | 38 | 182 | 134 | 86 |
| SC #21 | | 55 | 7 | 23 | 39 | | 55 | 7 | 151 | 103 |
| SC #22 | | 119 | 71 | 87 | 103 | | 119 | 71 | 23 | 167 |
| SC #23 | | 183 | 135 | 151 | 167 | | 183 | 135 | 87 | 39 |
| SC #24 | | 8 | 24 | 40 | 56 | | 8 | 152 | 104 | 56 |
| SC #25 | | 72 | 88 | 104 | 120 | | 72 | 24 | 168 | 120 |
| SC #26 | | 136 | 152 | 168 | 184 | | 136 | 88 | 40 | 184 |
| SC #27 | | 25 | 41 | 57 | 9 | | 153 | 105 | 57 | 9 |
| SC #28 | | 89 | 105 | 121 | 73 | | 25 | 169 | 121 | 73 |
| SC #29 | | 153 | 169 | 185 | 137 | | 89 | 41 | 185 | 137 |
| SC #30 | | 42 | 58 | 10 | 26 | | 106 | 58 | 10 | 154 |
| SC #31 | | 106 | 122 | 74 | 90 | | 170 | 122 | 74 | 26 |
| SC #32 | | 170 | 186 | 138 | 154 | | 42 | 186 | 138 | 90 |
| SC #33 | | 59 | 11 | 27 | 43 | | 59 | 11 | 155 | 107 |
| SC #34 | | 123 | 75 | 91 | 107 | | 123 | 75 | 27 | 171 |
| SC #35 | | 187 | 139 | 155 | 171 | | 187 | 139 | 91 | 43 |
| SC #36 | | 12 | 28 | 44 | 60 | | 12 | 156 | 108 | 60 |
| SC #37 | | 76 | 92 | 108 | 124 | | 76 | 28 | 172 | 124 |
| SC #38 | | 140 | 156 | 172 | 188 | | 140 | 92 | 44 | 188 |
| SC #39 | | 29 | 45 | 61 | 13 | | 157 | 109 | 61 | 13 |
| SC #40 | | 93 | 109 | 125 | 77 | | 29 | 173 | 125 | 77 |
| SC #41 | | 157 | 173 | 189 | 141 | | 93 | 45 | 189 | 141 |
| SC #42 | | 46 | 62 | 14 | 30 | | 110 | 62 | 14 | 158 |
| SC #43 | | 110 | 126 | 78 | 94 | | 174 | 126 | 78 | 30 |
| SC #44 | | 174 | 190 | 142 | 158 | | 46 | 190 | 142 | 94 |
| SC #45 | | 63 | 15 | 31 | 47 | | 63 | 15 | 159 | 111 |
| SC #46 | | 127 | 79 | 95 | 111 | | 127 | 79 | 31 | 175 |
| SC #47 | | 191 | 143 | 159 | 175 | | 191 | 143 | 95 | 47 |

Figure 11b

3D-A Interleaver Writing Order

| OFDM | #3 | #2 | #1 | #0 | #3 | #2 | #1 | #0 | #3 | #2 | #1 | #0 | #3 | #2 | #1 | #0 | |
|---|---|---|---|---|---|---|---|---|---|---|---|---|---|---|---|---|---|
| | 48 | 49 | 50 | 51 | 52 | 53 | 54 | 55 | 56 | 57 | 58 | 59 | 60 | 61 | 62 | 63 | SC# 3s |
| | 112 | 113 | 114 | 115 | 116 | 117 | 118 | 119 | 120 | 121 | 122 | 123 | 124 | 125 | 126 | 127 | SC# 3s |
| | 176 | 177 | 178 | 179 | 180 | 181 | 182 | 183 | 184 | 185 | 186 | 187 | 188 | 189 | 190 | 191 | SC# 3s+1 |
| | 240 | 241 | 242 | 243 | 244 | 245 | 246 | 247 | 248 | 249 | 250 | 251 | 252 | 253 | 254 | 255 | SC# 3s+1 |
| | 304 | 305 | 306 | 307 | 308 | 309 | 310 | 311 | 312 | 313 | 314 | 315 | 316 | 317 | 318 | 319 | SC# 3s+2 |
| | 368 | 369 | 370 | 371 | 372 | 373 | 374 | 375 | 376 | 377 | 378 | 379 | 380 | 381 | 382 | 383 | SC# 3s+2 |

| OFDM | #2 | #1 | #0 | #3 | #2 | #1 | #0 | #3 | #2 | #1 | #0 | #3 | #2 | #1 | #0 | #3 | |
|---|---|---|---|---|---|---|---|---|---|---|---|---|---|---|---|---|---|
| Slice#3 | 160 | 161 | 162 | 163 | 164 | 165 | 166 | 167 | 168 | 169 | 170 | 171 | 172 | 173 | 174 | 175 | SC# 3s |
| | 224 | 225 | 226 | 227 | 228 | 229 | 230 | 231 | 232 | 233 | 234 | 235 | 236 | 237 | 238 | 239 | SC# 3s |
| | 288 | 289 | 290 | 291 | 292 | 293 | 294 | 295 | 296 | 297 | 298 | 299 | 300 | 301 | 302 | 303 | SC# 3s+1 |
| | 352 | 353 | 354 | 355 | 356 | 357 | 358 | 359 | 360 | 361 | 362 | 363 | 364 | 365 | 366 | 367 | SC# 3s+1 |
| | 32 | 33 | 34 | 35 | 36 | 37 | 38 | 39 | 40 | 41 | 42 | 43 | 44 | 45 | 46 | 47 | SC# 3s+2 |
| | 96 | 97 | 98 | 99 | 100 | 101 | 102 | 103 | 104 | 105 | 106 | 107 | 108 | 109 | 110 | 111 | SC# 3s+2 |

| OFDM | #1 | #0 | #3 | #2 | #1 | #0 | #3 | #2 | #1 | #0 | #3 | #2 | #1 | #0 | #3 | #2 | |
|---|---|---|---|---|---|---|---|---|---|---|---|---|---|---|---|---|---|
| Slice#2 | 272 | 273 | 274 | 275 | 276 | 277 | 278 | 279 | 280 | 281 | 282 | 283 | 284 | 285 | 286 | 287 | SC# 3s |
| | 336 | 337 | 338 | 339 | 340 | 341 | 342 | 343 | 344 | 345 | 346 | 347 | 348 | 349 | 350 | 351 | SC# 3s |
| | 16 | 17 | 18 | 19 | 20 | 21 | 22 | 23 | 24 | 25 | 26 | 27 | 28 | 29 | 30 | 31 | SC# 3s+1 |
| | 80 | 81 | 82 | 83 | 84 | 85 | 86 | 87 | 88 | 89 | 90 | 91 | 92 | 93 | 94 | 95 | SC# 3s+1 |
| | 144 | 145 | 146 | 147 | 148 | 149 | 150 | 151 | 152 | 153 | 154 | 155 | 156 | 157 | 158 | 159 | SC# 3s+2 |
| | 208 | 209 | 210 | 211 | 212 | 213 | 214 | 215 | 216 | 217 | 218 | 219 | 220 | 221 | 222 | 223 | SC# 3s+2 |

| OFDM | #0 | #3 | #2 | #1 | #0 | #3 | #2 | #1 | #0 | #3 | #2 | #1 | #0 | #3 | #2 | #1 | |
|---|---|---|---|---|---|---|---|---|---|---|---|---|---|---|---|---|---|
| Slice#1 | 0 | 1 | 2 | 3 | 4 | 5 | 6 | 7 | 8 | 9 | 10 | 11 | 12 | 13 | 14 | 15 | SC# 3s |
| | 64 | 65 | 66 | 67 | 68 | 69 | 70 | 71 | 72 | 73 | 74 | 75 | 76 | 77 | 78 | 79 | SC# 3s |
| | 128 | 129 | 130 | 131 | 132 | 133 | 134 | 135 | 136 | 137 | 138 | 139 | 140 | 141 | 142 | 143 | SC# 3s+1 |
| | 192 | 193 | 194 | 195 | 196 | 197 | 198 | 199 | 200 | 201 | 202 | 203 | 204 | 205 | 206 | 207 | SC# 3s+1 |
| | 256 | 257 | 258 | 259 | 260 | 261 | 262 | 263 | 264 | 265 | 266 | 267 | 268 | 269 | 270 | 271 | SC# 3s+2 |
| | 320 | 321 | 322 | 323 | 324 | 325 | 326 | 327 | 328 | 329 | 330 | 331 | 332 | 333 | 334 | 335 | SC# 3s+2 |

Figure 12a

3D/3D-A Interleaver Reading Order (Subcarrier Mapping)

| OFDM | #3 | #2 | #1 | #0 | #3 | #2 | #1 | #0 | #3 | #2 | #1 | #0 | #3 | #2 | #1 | #0 | |
|---|---|---|---|---|---|---|---|---|---|---|---|---|---|---|---|---|---|
| Slice#4 | | 3 | 6 | 9 | | 15 | 18 | 21 | | 27 | 30 | 33 | | 39 | 42 | 45 | SC# 3s |
| | | 3 | 6 | 9 | | 15 | 18 | 21 | | 27 | 30 | 33 | | 39 | 42 | 45 | SC# 3s |
| | | 4 | 7 | 10 | | 16 | 19 | 22 | | 28 | 31 | 34 | | 40 | 43 | 46 | SC# 3s+1 |
| | | 4 | 7 | 10 | | 16 | 19 | 22 | | 28 | 31 | 34 | | 40 | 43 | 46 | SC# 3s+1 |
| | | 5 | 8 | 11 | | 17 | 20 | 23 | | 29 | 32 | 35 | | 41 | 44 | 47 | SC# 3s+2 |
| | | 5 | 8 | 11 | | 17 | 20 | 23 | | 29 | 32 | 35 | | 41 | 44 | 47 | SC# 3s+2 |

| OFDM | #2 | #1 | #0 | #3 | #2 | #1 | #0 | #3 | #2 | #1 | #0 | #3 | #2 | #1 | #0 | #3 | |
|---|---|---|---|---|---|---|---|---|---|---|---|---|---|---|---|---|---|
| Slice#3 | 0 | 3 | 6 | 9 | 12 | 15 | 18 | | 24 | 27 | 30 | 33 | 36 | 39 | 42 | | SC# 3s |
| | 0 | 3 | 6 | 9 | 12 | 15 | 18 | | 24 | 27 | 30 | 33 | 36 | 39 | 42 | | SC# 3s |
| | 1 | 4 | 7 | 10 | 13 | 16 | 19 | 22 | 25 | 28 | 31 | 34 | 37 | 40 | 43 | | SC# 3s+1 |
| | 1 | 4 | 7 | 10 | 13 | 16 | 19 | 22 | 25 | 28 | 31 | 34 | 37 | 40 | 43 | | SC# 3s+1 |
| | 2 | 5 | 8 | | 14 | 17 | 20 | 23 | 26 | 29 | 32 | 35 | 38 | 41 | 44 | | SC# 3s+2 |
| | 2 | 5 | 8 | | 14 | 17 | 20 | 23 | 26 | 29 | 32 | 35 | 38 | 41 | 44 | | SC# 3s+2 |

| OFDM | #1 | #0 | #3 | #2 | #1 | #0 | #3 | #2 | #1 | #0 | #3 | #2 | #1 | #0 | #3 | #2 | |
|---|---|---|---|---|---|---|---|---|---|---|---|---|---|---|---|---|---|
| Slice#2 | 0 | 3 | 6 | 9 | 12 | 15 | 18 | 21 | 24 | 27 | 30 | 33 | 36 | 39 | 42 | 45 | SC# 3s |
| | 0 | 3 | 6 | 9 | 12 | 15 | 18 | 21 | 24 | 27 | 30 | 33 | 36 | 39 | 42 | 45 | SC# 3s |
| | 1 | 4 | 7 | 10 | 13 | 16 | 19 | 22 | 25 | 28 | 31 | 34 | 37 | 40 | 43 | 46 | SC# 3s+1 |
| | 1 | 4 | 7 | 10 | 13 | 16 | 19 | 22 | 25 | 28 | 31 | 34 | 37 | 40 | 43 | 46 | SC# 3s+1 |
| | 2 | 5 | 8 | 11 | 14 | 17 | 20 | 23 | 26 | 29 | 32 | 35 | 38 | 41 | 44 | 47 | SC# 3s+2 |
| | 2 | 5 | 8 | 11 | 14 | 17 | 20 | 23 | 26 | 29 | 32 | 35 | 38 | 41 | 44 | 47 | SC# 3s+2 |

| OFDM | #0 | #3 | #2 | #1 | #0 | #3 | #2 | #1 | #0 | #3 | #2 | #1 | #0 | #3 | #2 | #1 | |
|---|---|---|---|---|---|---|---|---|---|---|---|---|---|---|---|---|---|
| Slice#1 | 0 | 3 | 6 | 9 | 12 | 15 | 18 | 21 | 24 | 27 | 30 | 33 | 36 | 39 | 42 | 45 | SC# 3s |
| | 0 | 3 | 6 | 9 | 12 | 15 | 18 | 21 | 24 | 27 | 30 | 33 | 36 | 39 | 42 | 45 | SC# 3s |
| | 1 | 4 | 7 | 10 | 13 | 16 | 19 | 22 | 25 | 28 | 31 | 34 | 37 | 40 | 43 | 46 | SC# 3s+1 |
| | 1 | 4 | 7 | 10 | 13 | 16 | 19 | 22 | 25 | 28 | 31 | 34 | 37 | 40 | 43 | 46 | SC# 3s+1 |
| | 2 | 5 | 8 | 11 | 14 | 17 | 20 | 23 | 26 | 29 | 32 | 35 | 38 | 41 | 44 | 47 | SC# 3s+2 |
| | 2 | 5 | 8 | 11 | 14 | 17 | 20 | 23 | 26 | 29 | 32 | 35 | 38 | 41 | 44 | 47 | SC# 3s+2 |

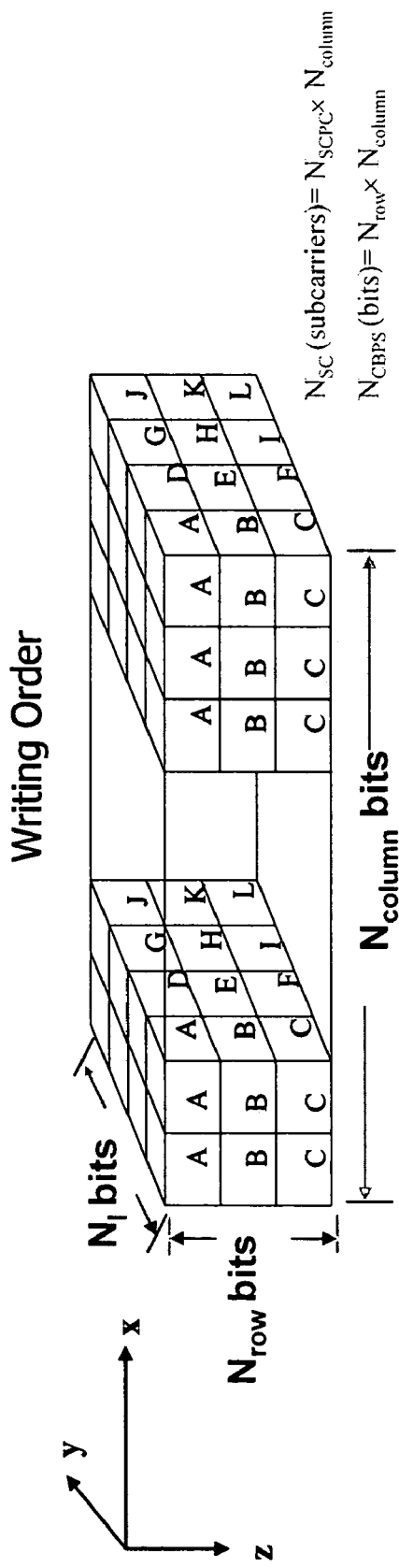
Figure 15a Writing order: A→B→C→D→E→F→G→H→I→J→K→L
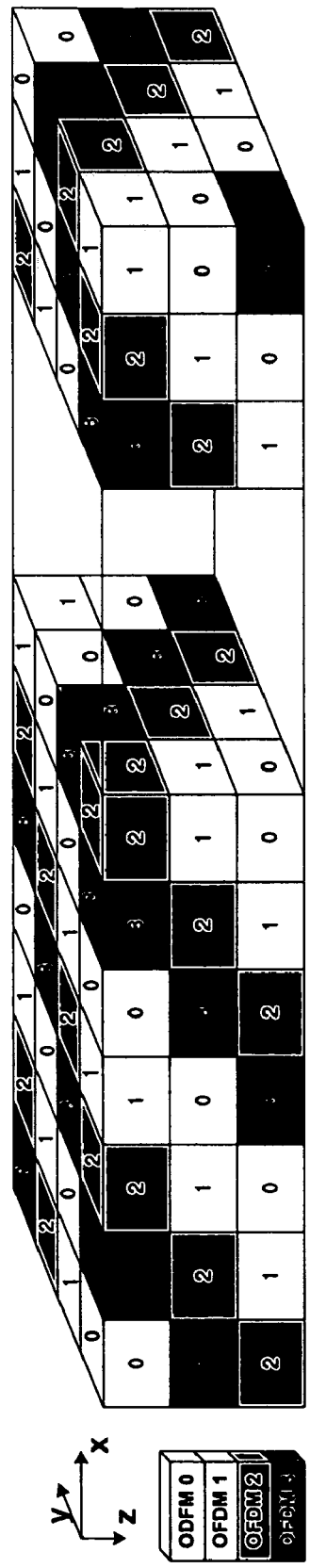
Figure 15b

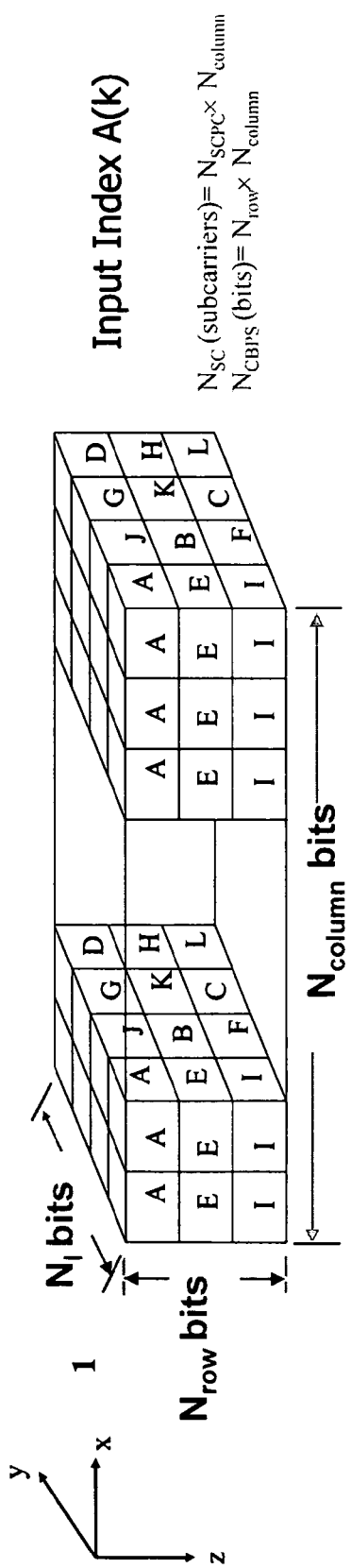
Figure 16a  Writing order: A→B→C→D→E→E→F→G→H→I→J→K→L
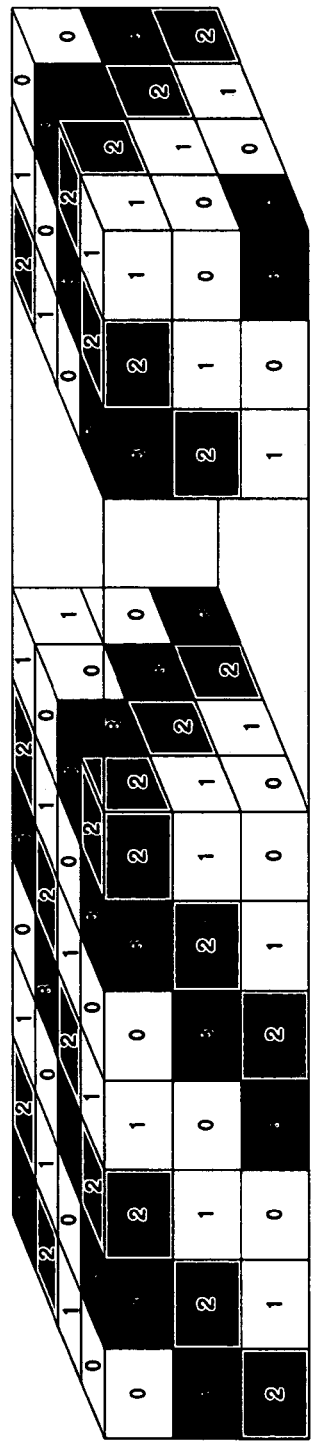
Figure 16b

Figure 17

| Pattern # \ Systems | 0 | 1 | 2 | 3 | 4 | 5 |
|---|---|---|---|---|---|---|
| 1(1) | 0 | N/A | N/A | N/A | N/A | N/A |
| 1(2) | 0 | 1 | N/A | N/A | N/A | N/A |
| 1(3) | 0 | 1 | 2 | N/A | N/A | N/A |
| 1(4) | 0 | 1 | 2 | 3 | N/A | N/A |
| 2(2) | (0,1) | N/A | N/A | N/A | N/A | N/A |
| 2(3) | (0,1) | (2,1) | (2,0) | N/A | N/A | N/A |
| 2(4) | (0,1) | (3,2) | (0,2) | (1,3) | (1,2) | (0,3) |
| 3(3) | (0,1,2) | N/A | N/A | N/A | N/A | N/A |
| 3(4) | (0,1,2) | (3,1,2) | (3,0,2) | (3,0,1) | N/A | N/A |
| 4(4) | (0,1,2,3) | N/A | N/A | N/A | N/A | N/A |

Figure 19a

| Systems | $N_{Pattern}$ | $N_l$ S_BC | $N_l$ Sub_BC |
|---|---|---|---|
| 1(1) | 1 | 1 | 1 |
| 1(2) | 2 | 2 | 1 |
| 1(3) | 3 | 3 | 1 |
| 1(4) | 4 | 4 | 1 |
| 2(2) | 1 | 2 | 2 |
| 2(3) | 3 | 6 | 2 |
| 2(4) | 6 | 12 | 2 |
| 3(3) | 1 | 3 | 3 |
| 3(4) | 4 | 12 | 3 |
| 4(4) | 1 | 4 | 4 |

Figure 19b

| Subcarrier | 0 | 1 | 2 | 3 | 4 | 5 | 6 | 7 | 8 | 9 | 10 | ... | 45 | 46 | 47 |
|---|---|---|---|---|---|---|---|---|---|---|---|---|---|---|---|
| OFDM 0, $C_0(s)$ | A(0) | A(32) | A(64) | A(17) | A(49) | A(81) | A(2) | A(34) | A(66) | A(19) | A(51) | ... | A(31) | A(63) | A(95) |
| OFDM 1, $C_1(s)$ | A(16) | A(48) | A(80) | A(1) | A(33) | A(65) | A(18) | A(50) | A(82) | A(3) | A(35) | ... | A(15) | A(47) | A(79) |

Figure 21b

| s | 0 | 1 | 2 | 3 | 4 | 5 | 6 | 7 | 8 | 9 | 10 | ... | 45 | 46 | 47 |
|---|---|---|---|---|---|---|---|---|---|---|---|---|---|---|---|
| Pattern(s) | 0 | 1 | 2 | 1 | 2 | 0 | 2 | 0 | 1 | 0 | 1 | ... | 0 | 1 | 2 |
| $D_0(s)$ | $C_0(0)$ | x | $C_1(2)$ | x | $C_1(4)$ | $C_0(5)$ | $C_1(6)$ | $C_0(7)$ | x | $C_0(9)$ | x | ... | $C_0(45)$ | x | $C_1(47)$ |
| $D_1(s)$ | $C_1(0)$ | $C_1(1)$ | x | $C_1(3)$ | x | $C_1(5)$ | x | $C_1(7)$ | $C_1(8)$ | $C_1(9)$ | $C_1(10)$ | ... | $C_1(45)$ | $C_1(46)$ | x |
| $D_2(s)$ | x | $C_0(1)$ | $C_0(2)$ | $C_0(3)$ | $C_0(4)$ | x | $C_0(6)$ | x | $C_0(8)$ | x | $C_0(10)$ | ... | x | $C_0(46)$ | $C_0(47)$ |

Figure 21c

| s | 0 | 1 | 2 | 3 | 4 | 5 | 6 | 7 | 8 | 9 | 10 | ... | 45 | 46 | 47 |
|---|---|---|---|---|---|---|---|---|---|---|---|---|---|---|---|
| Pattern(s) | 0 | 1 | 2 | 1 | 2 | 0 | 2 | 0 | 1 | 0 | 1 | ... | 0 | 1 | 2 |
| $D_0(s)$ | A(0) | 0 | A(80) | 0 | A(33) | A(81) | A(18) | A(34) | 0 | A(19) | 0 | ... | A(31) | 0 | A(79) |
| $D_1(s)$ | A(16) | A(48) | 0 | A(1) | 0 | A(65) | 0 | A(50) | A(82) | A(3) | A(35) | ... | A(15) | A(47) | 0 |
| $D_2(s)$ | 0 | A(32) | A(64) | A(17) | A(49) | 0 | A(2) | 0 | A(66) | 0 | A(51) | ... | 0 | A(63) | A(95) |

Figure 21d

| Pattern # Systems | 0 | 1 | 2 | 3 | 4 | 5 |
|---|---|---|---|---|---|---|
| 2(2) | (0,1) | N/A | N/A | N/A | N/A | N/A |
| 2(3) | (0,1) | (2,1) | (2,0) | N/A | N/A | N/A |
| 2(4) | (0,1) | (3,2) | (0,2) | (1,3) | (1,2) | (0,3) |

Figure 23a

| Systems | $N_l$ | |
|---|---|---|
| | S_BC | Sub_BC |
| 2(2) | 2 | 2 |
| 2(3) | 6 | 2 |
| 2(4) | 12 | 2 |

Figure 23b

SYSTEM AND METHOD FOR PROVIDING 3-DIMENSIONAL JOINT INTERLEAVER AND CIRCULATION TRANSMISSIONS

REFERENCE TO PRIOR PROVISIONAL APPLICATIONS

This application claims the benefit of U.S. Provisional Application No. 60/620,724, filed Oct. 22, 2004.

BACKGROUND

Field of the Invention

The present invention relates generally to in wireless communication. More particularly, the present invention relates to a 3-dimensional (3D) joint interleaver and circulation transmissions for Multiple-Input-Multiple-Output (MIMO) systems containing multiple transmitter and receiver antennas.

Multiple-input-multiple-output (MIMO) system contains multiple transmitter and receiver antennas. An advantage of such MIMO systems is that by using multiple transmitter and receiver antennas to transmit and receive multiple data streams at the same time MIMO systems boost the data throughput multiple times. System performance in a MIMO system can be optimized by transmitting the data streams with a Gaussian distribution. That is, the transmitted data streams should be independent and have zero correlation. One way to achieve such independence is to try to exploit all available diversities, i.e., diversities in frequency, time and space when transmitting the data streams. Consequently, a MIMO system realizes its best performance by exploiting the maximal randomness (or minimal correlation) of the transmitted data streams in frequency, time and space.

Due to device size limitations, antennas must be placed close to one another. Unfortunately, such proximity causes the transmitted and received data streams to be highly correlated, which, in turn, degrades system performance. Therefore, it is desirable to minimize the correlation of transmitted data streams, and thereby improve the performance of a MIMO system.

SUMMARY

Embodiments of the present invention may improve MIMO system performance by better exploiting diversities in frequency, time and/or space. For example, in one example, a MIMO system uses 3D interleaver and circulation transmission to minimize the correlation of transmitted data streams, thereby providing improved performance in a MIMO system.

In one embodiment, an apparatus for use in a wireless system may include a convolutional encoder to input data and output encoded data bits and an interleaver to input the encoded data bits and output interleaved data bits. The interleaver interleaves encoded bits output by the convolutional encoder and increases diversity by optimizing the separations between adjacent encoded bits. One or more quadrature amplitude modulation mappers map the interleaved encoded bits to a plurality of subcarriers. A plurality of IFFT processors coupled to generate the Orthogonal-Frequency-Division-Multiplexing (OFDM) symbols from the subcarriers. A circulation transmission processor for optimizing diversity through transmission of the OFDM symbols. In one embodiment, the circulation transmission processor performs OFDM symbol-based circulation. In another embodiment, the circulation transmission processor performs subcarrier-based circulation. The optimized data streams are transmitted using a plurality of antennas.

In another embodiment, a method for transmitting information in a wireless communication system may include encoding input data to output encoded data bits and interleaving the output encoded bits. A number of techniques can be used for the interleaving. Each technique assists in optimizing diversity between adjacent output encoded bits. The method further includes mapping the interleaved encoded bits to a plurality of subcarriers and generating information symbols from the subcarriers. In addition, methods in some embodiments may transmit the subcarriers and symbols so as to optimize diversity in time, space and frequency.

In still another embodiment, a system, such as a communication network, a computer or a communication system, or a transceiver, may include a wireless transmission apparatus. The apparatus may include: an encoder being capable of encoding input data to generate an input bit stream comprising a plurality of encoded data bits; and an interleaver being capable of interleaving the encoded data bits to generate an output bit stream comprising a plurality of output data bits for transmission of the output bit stream through at least two channels in at least two OFDM symbols. In one example, the interleaver may be capable of: assigning two adjacent bits in the input bit stream to two bits in the output bit stream corresponding to two separate OFDM symbols in the output bit stream; and assigning two adjacent bits in the input bit stream to two bits in the output bit stream corresponding to two separate subcarriers.

In still another embodiment, a method for transmitting information in a wireless communication system may include: receiving an input data for transmission; encoding input data to generate an input bit stream comprising a plurality of encoded data bits; and interleaving the encoded data bits to generate an output bit stream comprising a plurality of output data bits for transmission through at least two channels in at least two OFDM symbols. In one example, the interleaving of the encoded data bits may include: assigning two adjacent bits of the input bit stream to two bits of the output bit stream corresponding to two separate OFDM symbols; and assigning two adjacent bits of the input bit stream to two bits of the output bit stream corresponding to two separate subcarriers.

BRIEF DESCRIPTION OF DRAWINGS

FIGS. 4a and 4b illustrate an exemplary interleaver mapping for an interleaver for four BPSK modulated OFDM symbols according to an embodiment of the present invention.

FIGS. 5a and 5b illustrate an exemplary interleaver mapping for an interleaver for four QPSK modulated OFDM symbols according to an embodiment of the present invention.

FIGS. 6a and 6b illustrate an exemplary interleaver mapping for an interleaver for four 16QAM modulated OFDM symbols according to an embodiment of the present invention.

FIG. 10 illustrates a mapping corresponding to a 3D-A interleaver according to an embodiment of the present invention.

FIG. 11a compares exemplary writing and reading orders of a 3D interleaver with a 3D-A interleaver operating upon four BPSK modulate OFDM symbols according to an embodiment of the present invention.

FIG. 11b illustrates differences resulting from application of a 3D and 3D-A interleaver operating upon four BPSK modulate OFDM symbols according to embodiments of the present invention.

FIGS. 12a and 12b illustrate exemplary reading and writing orders for a 3D-A interleaver operating upon four QPSK modulate OFDM symbols according to an embodiment of the present invention.

FIGS. 13a and 13b illustrate reading and writing orders of a 3D-A interleaver operating upon four 16QAM modulated OFDM symbols according to an embodiment of the present invention.

FIGS. 14a and 14b illustrate reading and writing orders of a 3D-A interleaver operating upon four 64QAM modulated OFDM symbols according to an embodiment of the present invention.

FIGS. 15a-b illustrate an interleaver mapping for a 3D-B1 interleaver according to an embodiment of the present invention.

FIGS. 16a-b illustrate an interleaver mapping for a 3D-B2 interleaver according to an embodiment of the present invention.

FIG. 17 illustrates a mapping corresponding to a 3D interleaver according to another embodiment of the present invention.

FIG. 19a illustrates circulation patterns for an S_BC system and a Sub_BC system according to an embodiment of the present invention.

FIG. 19b provides the number of circulation patterns and interleaver sizes corresponding to the systems illustrated in FIG. 19b.

FIG. 20a is a schematic diagram of an exemplary 2(3) S_BC Circular SMX system according to an embodiment of the present invention.

FIG. 20b is a table illustrating exemplary circulation patterns to use in the 2(3) S_BC Circular SMX system illustrated in FIG. 20a.

FIG. 21b is a table providing an exemplary interleaver mapping for an interleaver according to an embodiment of the present invention.

FIG. 21c is a table providing exemplary Sub_BC circulations patterns for each subcarrier#s according to an embodiment of the present invention.

FIG. 21d is a table illustrating separations according to the interleaving by an embodiment of the system illustrated in FIG. 21a.

FIG. 23a is a table comprising circulation patterns that can be employed by the circulation units of FIGS. 22a and 22b according to preferred embodiments of the present invention.

FIG. 23b is a table providing interleaver sizes that can be employed according to embodiments of the present invention.

DETAILED DESCRIPTION OF THE PREFERRED EMBODIMENTS

Glossary

The following notations are used throughout the specification:

L—Number of OFDM symbols from convolutional encoder outputs $N_I$—Number of OFDM symbols per 3D joint Interleaver $N_{OFDM}$—Number of OFDM symbols that are transmitted simultaneously M—Number of transmitter antennas ($M \geq N_{OFDM}$)

$N_{OFDM}$(M) system—a MIMO system (with M transmitter antennas) that is transmitting $N_{OFDM}$ symbols at the same time.

N—Number of receiver antennas

M×N system—a MIMO system has M transmitter and N receiver antennas $N_{OFDM}$(M)×N system—a MIMO system (with M transmitter and N receiver antennas) that is transmitting $N_{OFDM}$ symbols at the same time.

$N_{CBPS}$—Number of encoded bits per OFDM symbol.

$N_{SC}$—Number of data tones (subcarriers) per OFDM symbol.

$N_{BPSC}$—Number of encoded bits per subcarrier.

Figure 1A:
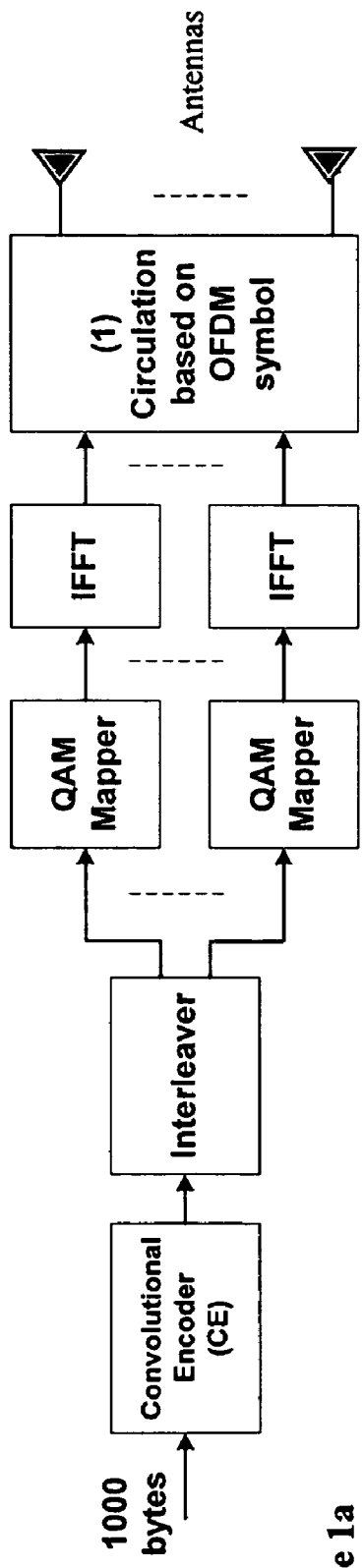
FIG. 1a is a schematic block diagram illustrating a MIMO transmitter for use in wireless communications using OFDM symbol-based circulation transmission according to an embodiment of the present invention.

FIG. 1a is a schematic block diagram illustrating a MIMO transmitter for use in a wireless communications according to an embodiment of the present invention. Despite having multiple transmitter and receiver antennas, in general a MIMO system cannot transmit and receive data at the same time. Therefore, most MIMO system designs share the same antennas to transmit and receive data. As shown in FIG. 1a, a convolutional encoder (CE) encodes a data block, for example, of 1000 bytes of data. An interleaver interleaves the bits of the encoded data. As described below, the interleaver functions to increase separation between encoded bits. A bank of parallel Quadrature Amplitude Modulation (QAM) Mappers modulates the interleaved bits to subcarriers. In the MIMO system illustrated in FIG. 1a, the outputs of the QAM mappers feed a bank of parallel Inverse-Fast-Fourier-Transform (IFFT) processors. The IFFT processors process their inputs to produce OFDM symbols. To improve spatial diversity, an OFDM-symbol circulator (described in more detail below) performs OFDM symbol based circulation on the outputs of the IFFT bank. A bank of antennas transmits the circulated data.

Figure 1B:
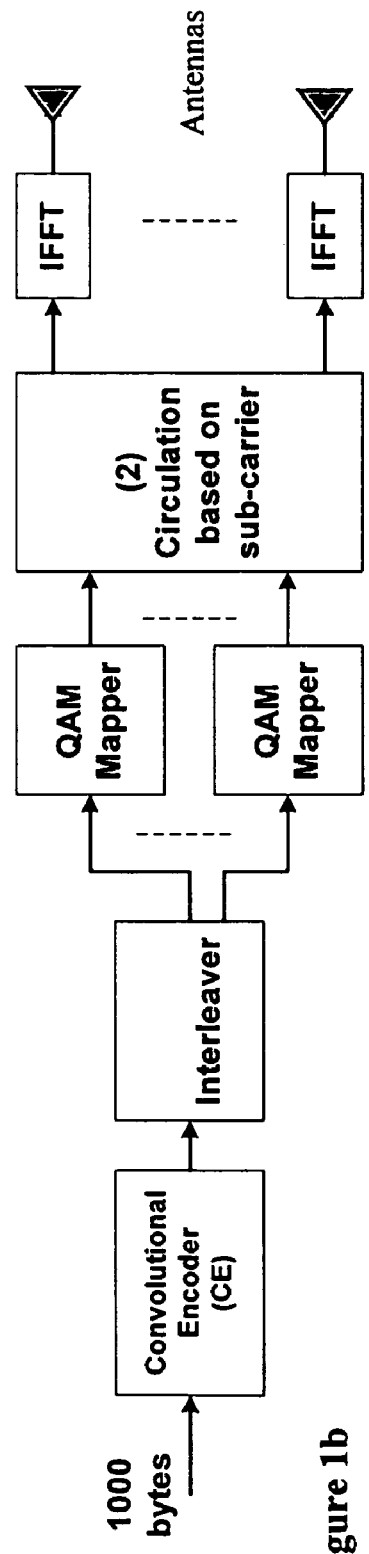
FIG. 1b is a schematic block diagram illustrating a MIMO transmitter for use in wireless communications using subcarrier-based circulation transmission according to an embodiment of the present invention.

FIG. 1b is a schematic block diagram of a MIMO system according to another embodiment of the present invention. In the MIMO system illustrated in FIG. 1b, spatial diversity is supplied by a subcarrier-based circulator. The subcarrier-based circulator operates on the output of the bank of QAM mappers and supplies the circulated data to a bank of IFFT processors. The data is then forwarded to antennas for transmission.

Since the convolutional encoder performs shift-and-add logic operations on the input data bits, its outputs are highly correlated. This is especially true for the adjacent encoded bits. Increasing the separation between any two encoded bits reduces their correlation. With sufficient separation, the correlation becomes negligible. What constitutes sufficient separation for negligible correlation depends on the selected CE code. The interleaver maximizes the separations of all encoded bits, especially for the adjacent encoded bits Another consideration with MIMO systems is that multiple antennas do not guarantee successful transmission and reception of data streams from all antennas simultaneously. For example, if the signal-to-noise-ratio (SNR) at the receiver front-end is insufficient, the number of data streams can be transmitted and received successfully is less than the total number of available antennas. For example, due to limited SNR in a 4-antenna MIMO system, it may be possible to only reliably transmit one, two, or three data streams to the receiver.

Information theory predicts that a MIMO system can achieve optimal performance by transmitting the same data from all available antennas. Consequently, in a 4-antenna MIMO system, theoretically it is best to transmit the data streams using 4 antennas, rather than just 2 antennas, for example. This is particularly true for MIMO systems used in the wireless communications where transmitted data streams pass through numerous multipaths and interferences prior to reception at another MIMO receiver. In such a case, transmitting the same data from all available antennas would provide maximal transmit diversity gain. To improve spatial diversity, all available antennas are used by introducing circular transmissions where the number of data streams to be transmitted is less than the number of available transmitter antennas. For example, FIGS. 1a and 1b illustrate two exemplary circulation transmissions that can be used according to embodiments of the present invention. FIG. 1a illustrates an example of OFDM-symbol based circulation transmission. FIG. 1b illustrates an example of subcarrier based circulation transmission.

In an OFDM based MIMO system, generally there are M IFFTs, one for each transmitter antenna. In the examples shown in FIGS. 1a and 1b, each IFFT has a plurality of QAM mapped signals as its frequency-domain multiplexed inputs.

The total available frequency bandwidth is equally divided into $2^N$ sub-bands (subcarriers). Although a MIMO system can use every subcarrier (SC) to transmit QAM mapped signals, typically several outer subcarriers are not used to transmit signals in order to avoid adjacent channel interference (ACI). Furthermore, some subcarriers are reserved for pilot tones for the synchronization purpose. For example, in a particular implementation, a MIMO system using 64-point IFFTs might only use 48 subcarriers to transmit signals.

Figure 2:
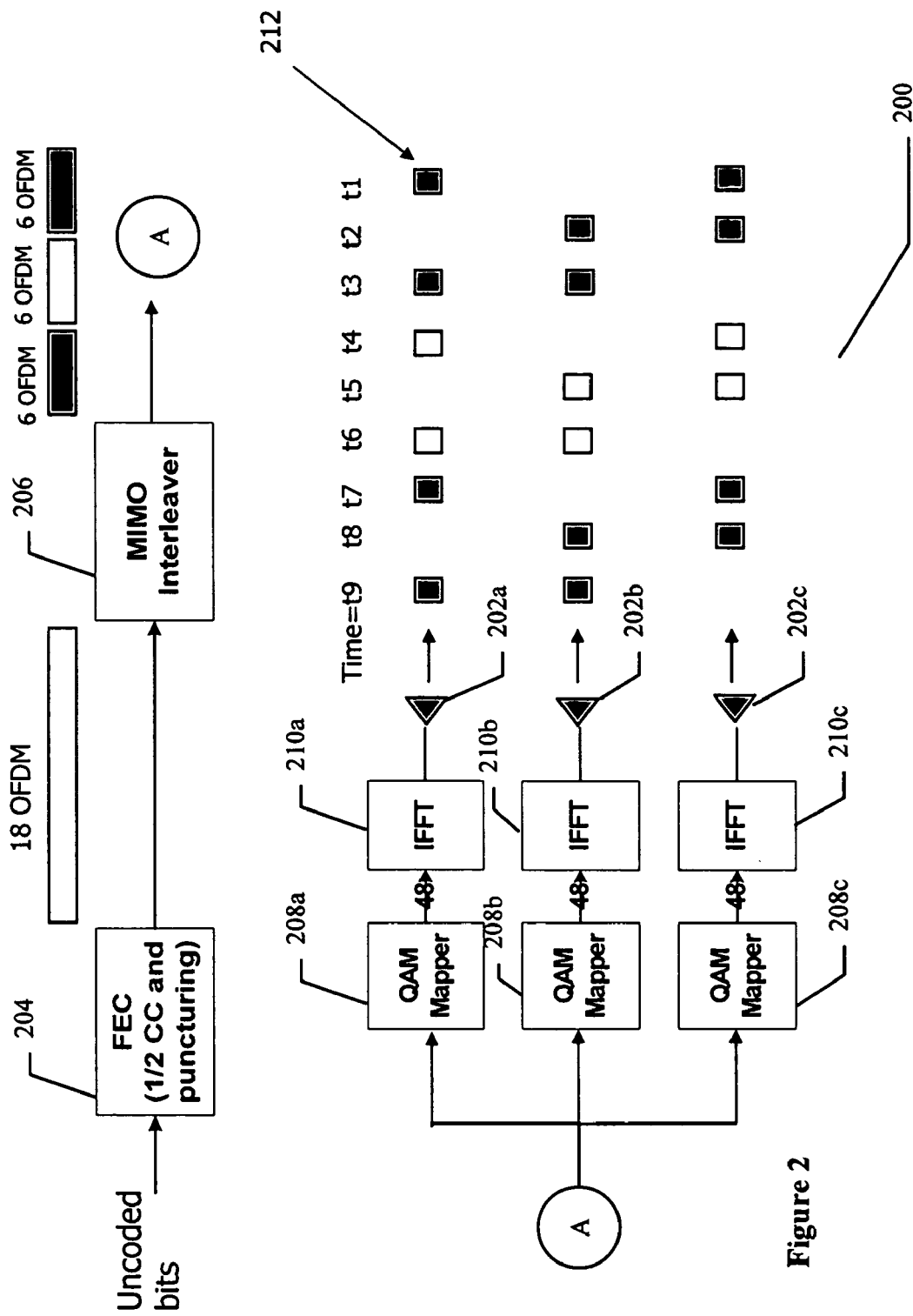
FIG. 2 illustrates an exemplary MIMO system transmitting 18 OFDM symbols from three transmitter antennas according to an embodiment of the present invention.

FIG. 2 is a schematic diagram of an exemplary example of a MIMO system 200 having three transmitter antennas 202a, 202b, and 202c that employ OFDM symbol-based circulation transmission. MIMO system 200 includes an encoder (FEC) 204. In exemplary MIMO system 200, FEC 204 outputs 18 OFDM symbols. An interleaver 206 interleaves the 18 OFDM symbols output by the FEC. For example, interleaver 206 can interleave the 18 OFDM symbols 3 times, 6 OFDM symbols at a time. The interleaved OFDM symbols are input to a bank of QAM mappers 208a, 208b, and 208c. To avoid ACI, and provide pilots subcarriers for synchronization, only 48 of the 64 available subcarriers are used to transmit data. The unused subcarriers are assigned zero values. Consequently, QAM mappers 208a, 208b and 208c modulate the interleaved data onto 48 subcarriers. IFFTs 210a, 210b and 210c operate upon the data output by QAM mappers 208a, 208b, and 208c. Antennas 202a, 202b and 202c transmit the data output by IFFTs 210a, 210b and 210c.

As shown in FIG. 2, in the exemplary MIMO system 200, only 2 of the 3 available antennas are used simultaneously to transmit data. The remaining one antenna is turned off completely. Because not all of the antennas are used simultaneously, circulation transmission is used to improve spatial diversity. As shown in FIG. 2, the total transmission requires nine times of one OFDM symbol time. An exemplary OFDM symbol is OFDM symbol 212. It is observed that a fixed pattern is applied to select $N_{OFDM}$ out of total M available antennas for transmission.

Each OFDM symbol contains $N_{CBPS}$ encoded bits from the convolutional encoder, such as FEC 204. For example, in MIMO system 200, $N_{CBPS}$=48. The OFDM symbol mapping depends on the modulation applied by the QAM mappers. For example, in binary modulations, such as BPSK, 1 bit is mapped to a BPSK signal. In QAM modulations, such as QPSK, 2 bits are mapped to a QPSK signal. Likewise, in higher order modulations, such as 16QAM and 64QAM, 4 and 6 bits respectively are mapped to corresponding one 16QAM and one 64QAM signals. In summary, one BPSK modulated OFDM symbol contains 48×1 encoded bits from the interleaver. Likewise, a QPSK modulated OFDM symbol contains 48×2 encoded bits from the interleaver. A 16QAM modulated OFDM symbol contains 48×4 encoded bits from the interleaver. A 64QAM modulated OFDM symbol contains 48×6 encoded bits from the interleaver. Each of the resulting mappings constitutes one input (subcarrier) to an IFFT.

An OFDM-based MIMO system having M transmitter antennas can transmit at most M OFDM symbols simultaneously, one OFDM per transmitting antenna. To maximize diversity, the interleaver should randomize the correlations of all transmitted signals, i.e., $N_{CBPS} \times N_{OFDM}$ bits. For example, randomization of 48×4 bits increases diversity if four BPSK modulated OFDM symbols are transmitted at the same time. Therefore, the interleaver size ($N_I$) should be an integer multiple of the number of OFDM symbols transmitted at the same time ($N_{OFDM}$).

In exemplary MIMO system 200, the total encoded bits are contained in 18 OFDM symbols. Theoretically, optimal performance is expected if all encoded bits are interleaved and transmitted, i.e., the size of the optimal interleaver is 18 OFDM symbols. While this may be so, in some cases, such an implementation may introduce significant decoding delay and buffering at receiver. The receiver must receive and de-interleave all 18 OFDM symbols before decoding the data. For a MIMO system transmitting hundreds of mega-bit-per-second (Mbps), such a design may be difficult to implement. One option is trying to randomize the total simultaneously transmitted data, i.e., $N_I = N_{OFDM}$ OFDM symbols. Another option is to increase the interleaver size to an integer multiple of $N_{OFDM}$ OFDM symbols, thereby including more randomness and diversity. In FIG. 2 for example, two OFDM symbols are transmitted simultaneously and the interleaver size is six OFDM symbols, i.e., three times the value of $N_{OFDM}$.

Some possible advantages of an OFDM-based MIMO system shown in FIG. 2 are illustrated below. For example, there are a total of 48×$N_{OFDM}$ tones available that provide improved frequency diversity. There are three transmitter antennas available that provide improved spatial diversity. The signals are transmitted in different time slots (t1 to t9 in FIG. 2), thereby providing improved time diversity. Additional time diversity is provided by the multipath channels between the transmitter and receiver that provide the delay-and-sum of transmitted signals at receiver front-end.

Despite the advantages of adding circulation transmission to increase diversity in time, space, and frequency, a MIMO system can be further optimized. For example, the outputs from the convolutional encoder may be highly correlated, especially between adjacent encoded bits. Further, adjacent subcarriers of the same OFDM symbol may also be highly correlated. Moreover, because all antennas are built closely on the same device, the transmitted and received signal of each antenna may be highly correlated. For example, if all the antennas are built in a one-inch wide device and the distance between two MIMO devices is about 10 or 20 meter, signals transmitted or received from all antennas may be highly correlated. As a result, although an OFDM-based MIMO system may have all available diversities in frequency, space and time, the encoded symbols and transmitted signals all may be highly correlated. As a result, benefits from increasing diversity in a MIMO system may not be fully realized. However, using techniques to minimize correlations can regain the diversity benefits. For example, using an interleaver according to embodiments of the present invention and circulation transmissions may provide a way to separate the highly correlated encoded bits into all available diversities. Embodiments of such interleavers and circulation transmission processors are described in more detail below.

Figure 3:
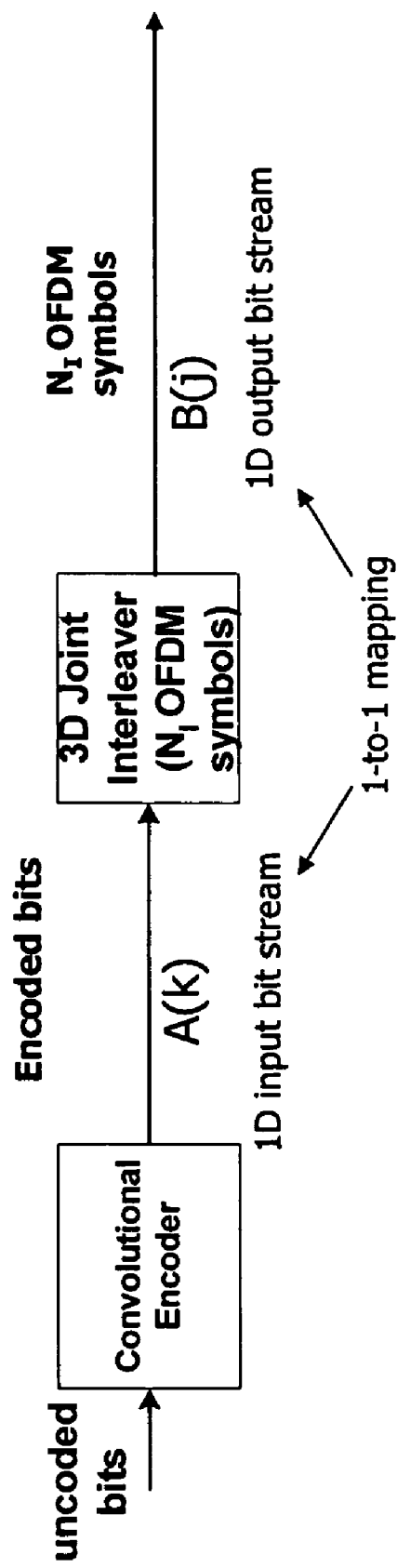
FIG. 3 illustrates an exemplary relationship of inputs and outputs according to an embodiment of the present invention.

FIG. 3 is a schematic diagram of a MIMO system to illustrate the relationship of inputs, A(k)'s, and outputs, B(j)'s, of an exemplary 3D interleaver according to an embodiment of the present invention. The encoded bits from a convolutional encoder (CE) is a 1-D bit stream denoted as A(k)'s, where index k=0, 1, 2, . . . denotes the $k^{th}$ output from the CE. In other words, bits A(0) and A(1) are consecutive encoded bits. As a result, bits A(0), A(1), A(2), . . . are highly correlated, adjacent encoded bits. The purpose of any interleaver is to separate the adjacent encoded bits as much as possible in all available diversities. Although embodiments of the present invention are based on 3D blocks as described below, the output bit stream may be defined as an 1-to-1 mapping from A(k) to B(j), where B(j) is the $j^{th}$ output from the proposed 3D interleaver.

An interleaver according to a first embodiment of the present invention is provided by Equations (1) and (2):

Equation (1)—First Permutation Rule:

$$i = N_{CBPS}\left[\left\{\left(\text{floor}\left(\frac{k}{16}\right)\text{mod}(N_I)\right) - (k\text{mod}(16))\right\}\text{mod}(N_I)\right] + \frac{N_{CBPS}}{16}(k\text{mod}(16)) + \text{floor}\left(\frac{k}{16N_I}\right) \quad (1)$$

where $N_I$ is the number of OFDM symbols per interleaver and k=0, 1, . . . , $N_{CBPS}$×$N_I$−1 and floor(x) is the largest integer smaller than or equal to x.

Equation (2)—Second Permutation Rule:

$$j = N_{CBPS}\left[\text{floor}\left(\frac{i}{N_{CBPS}}\right)\right] + s \cdot \left[\text{floor}\left(\frac{i\text{mod}(N_{CBPS})}{s}\right)\right] + \left[(i\text{mod}(N_{CBPS})) + N_{CBPS} - \text{floor}\left\{\frac{16\,(i\text{mod}(N_{CBPS}))}{N_{CBPS}}\right\}\right]\text{mod}(s) \quad (2)$$

where s=max($N_{BPSC}$/2, 1) and i=0, 1, . . . , $N_{CBPS}$×$N_I$−1.

In Equation (1), $N_I$ is the number of OFDM symbols per interleaver and k=0, 1, . . . , $N_{CBPS}$×$N_I$−1. In Equation (2), s=max($N_{CBPS}$/2,1) and i=0, 1, . . . , $N_{CBPS}$×$N_I$−1. Such an interleaver can readily be implemented with a 3D block memory. In embodiments of the present invention, the first permutation rule is used for all modulated OFDM symbols from BPSK to 64QAM, but the second permutation rule is only applied to higher order modulated OFDM symbols, including for example, 16QAM, 64QAM, 256QAM, etc.

FIGS. 4a and 4b illustrate exemplary mappings of input indexes to output indices for an interleaver for four BPSK modulated OFDM symbols according to an embodiment of the present invention. The input and output indices, k and j, of the exemplary 3D interleaver are defined in FIG. 3. As shown in FIGS. 4a-b, the block memory representation of the exemplary interleaver is organized as a 16×3×4 3D block. This representation corresponds to 4 BPSK modulated OFDM symbols or a sum of 48×4 (192) encoded bits. Each numbered cell in FIGS. 4a and 4b corresponds to an encoded bit. The numbers in the cells shown in FIGS. 4a-b are the indices. A(0), A(1), A(2), . . . , A(191) represent the data bits in the one-dimensional input stream. B(0), B(1), B(2), . . . , B(47) are grouped into OFDM symbol #0, B(48), B(49), . . . , B(95) are grouped into OFDM symbol #1, B(96), B(97), . . . , B(143) are grouped into OFDM symbol #2, and B(144), B(145), . . . , B(191) are grouped into OFDM symbols #3. This numbering scheme holds throughout this description unless noted otherwise. FIGS. 4a and 4B illustrate the mapping relationship between the input bits A(k) and the output bits B(j). FIG. 4a illustrates the input indices, and FIG. 4b illustrates the output indices. For example, cell 402 has an input index of zero, and cell 452 has an input index of zero.

According to one embodiment of the present invention, an OFDM symbol comprises 16×3 (48) encoded bits. The 48 encoded bits correspond to 48 subcarriers in the frequency domain. Such an embodiment is particularly designed to be backward compatible to an 802.11a or 802.11g system, which transmits one OFDM symbol containing 48 data subcarriers, at a time. Assuming in an embodiment of the present invention that four OFDM symbols can be transmitted simultaneously from four antennas. Such an embodiment of the present invention requires an interleaver having a size equal to 48×4 bits to separate the correlations of 48×4 encoded bits to 48×4 subcarriers in frequency domain and four antennas in space domain.

The number of output OFDM symbols generally equals the number of antennas available for transmission. If only two transmitter antennas are available, the interleaver size may be reduced to two OFDM symbols. The corresponding 3D interleaver can be represented as a 16×3×2 3D block with only two 16×3-bit output OFDM symbols each having 48 encoded bits. For higher order modulations, each symbol contains correspondingly more encoded bits. For example, a QPSK modulated OFDM symbol comprises 48×2 (96) encoded bits, a 16QAM modulated OFDM symbol comprises 48×4 (192) encoded bits, and a 64QAM modulated OFDM symbol comprises 48×6 (288) encoded bits. Mappings for higher order OFDM modulated symbols are illustrated in FIGS. 5*a-b*, 6*a-b* and 7*a-b*.

In FIGS. 4*a* and 4*b*, each of the numbers shown on the small 3D cells corresponds to the indices of input and output. Thus, A(0), A(1), A(2), . . . A($N_I * N_{CBPS}$−1) correspond to the encoded bits output by a convolutional encoder. Similarly, B(0), B(1), B(2), . . . B($N_I * N_{CBPS}$−1) are the outputs of the 3D interleaver. For example, by operation of an interleaver according to a first embodiment of the present invention, B(0)=A(0), B(1)=A(64), B(2)=A(128), B(3)=A(17), B(4)=A(81), and B(5)=A(145).

According to an embodiment of the present invention, for transmission, the first 48 interleaver outputs, i.e., B(0) to B(47), are sent to BPSK mappers for SC#0 to SC#47, respectively. The outputs of these BPSK mappers are combined as the OFDM symbol #0. Similarly, the next 48 interleaver outputs, i.e., B(48) to B(95), are sent the BPSK mappers for SC#0 to SC#47, respectively. The outputs of these BPSK mappers are combined as the OFDM symbol #1. In a similar manner, OFDM symbols #2, #3, are based on the interleaver outputs, B(96) to B(143), and B(144) to B(191), respectively.

Using a 3D interleaver of the example illustrated in FIGS. 4*a-b*, the following properties may be observed:

(a) B(O), B(1), B(2), . . . , B(47) are grouped into OFDM 0, B(48), B(49), . . . , B(95) are grouped into OFDM 1, B(96), B(97), . . . , B(143) are grouped into OFDM 2, and B(144), B(145), . . . , B(191) are grouped into OFDM 3.

(b) The adjacent input encoded bits, i.e., those having the highest correlation, are mapped into the same coordinate-x as shown in FIG. 4*a*.

(c) The number of total subcarriers in one OFDM symbol can be represented by the multiplication of $N_{column}$ by $N_{row}$. In the present example, for example, $N_{column}$=16 and $N_{row}$=3. Therefore, there are 48 subcarriers.

(d) Each shading variation shown in FIG. 4*b* represents a different OFDM symbol. Thus, the 4 shades of gray shown in FIG. 4*b* represent 4 different OFDM symbols. As can be seen, any two consecutive cells (i.e., any consecutive two bits) on the same level are assigned to two of four different shades. This demonstrates diversity between OFDM symbols from consecutive bits. For example, bits A(0) and A(1), which are mapped into bits B(0) and B(147), respectively, in the example shown in FIG. 4*b*, have different gray shadings. Consequently, they are transmitted in different OFDM symbols. As a result, diversity is increased.

(e) Moreover, arbitrary consecutive encoded bits, A(k) and A(k+1), have three-subcarrier separation and may be sent to different OFDM symbols. For example, assume B(0), . . . B(47) are assigned to OFDM#0 and that B(144) to B(191) are assigned to OFDM#3. In such a case, bit B(0)=A(0) can be sent and BPSK modulated into the subcarrier#0 of OFDM#0, while the bit A(1)=B(147) can be sent and BPSK modulated into the SC#3 of OFDM#3. The separation of A(0) and A(1) is SC#0 to SC#3 or three subcarriers in frequency domain. The different antennas applied to two consecutive bits A(k) and A(k+1) provide the transmit diversity gain.

(f) Each column of FIG. 4*b* (3 bits in the z direction) represents three adjacent subcarriers of the same OFDM symbol. Thus, for example, B(0), B(1), and B(2) can be sent to BPSK mappers for SC#0, SC#1, and SC#2 respectively of OFDM#0. The encoded bits A(k)'s in different columns indicate different sets of three adjacent subcarriers in frequency domain.

(g) Encoded bits A(k)'s in the same coordinate-y are modulated into the same subcarrier of different OFDM symbols. For example, bits A(0), A(16), A(32), and A(48), which correspond to B(0), B(48), B(96), and B(144), are modulated to SC#0 of OFDM symbol#0, #1, #2, and #3, respectively.

In one example, a wireless transmission apparatus similar to the embodiments noted above or below may be used in any system, such as a communication network, a computer or communication system, or a transceiver. The wireless transmission apparatus may include: an encoder being capable of encoding input data to generate an input bit stream comprising a plurality of encoded data bits; and an interleaver being capable of interleaving the encoded data bits to generate an output bit stream comprising a plurality of output data bits for transmission of the output bit stream through at least two channels in at least two OFDM symbols. In one example, the interleaver may be capable of: assigning two adjacent bits in the input bit stream to two bits in the output bit stream corresponding to two separate OFDM symbols in the output bit stream; and assigning two adjacent bits in the input bit stream to two bits in the output bit stream corresponding to two separate subcarriers. In particular, the channel described here may be a channel for wireless communication, such as a radio frequency (RF) channel.

In some examples, the interleaver may be designed to become capable of: assigning any two adjacent bits in the input bit stream to two bits in the output bit stream corresponding to two separate OFDM symbols in the output bit stream; and assigning any two adjacent bits in the input bit stream to two bits in the output bit stream corresponding to two separate subcarriers. This may create more diversity and reduce the correlation between neighboring bits for wireless transmission. In one example, the interleaver may be capable of assigning the encoded data bits to the output data bits by operating based on a three-dimensional block capable of identifying the separation of two adjacent bits in the input bit stream to two bits in the output stream corresponding to separate OFDM symbols and separate subcarriers. FIG. 4*b* and the additional figures described below provide different examples of a three-dimensional block that may be used. Various three-dimensional blocks may be used depending on the system or transmission configuration.

In one example, the apparatus is for an OFDM-based MIMO system and the interleaver, as illustrated above, may be capable of converting the input bit stream having data bits A(k), k=0, 1, 2, . . . $N_{CBPS} \times N_I$−1, into the output bit stream of $N_I$ OFDM symbols, wherein each OFDM symbol has $N_{CBPS}$ bits and $N_{SC}$ subcarriers and each subcarrier includes $N_{BPSC}$ bits. In particular, the interleaver may have two design parameters selected or pre-assigned, $N_{row}$ and $N_{column}$, with $N_{row} \times N_{column} = N_{CBPS}$. The interleaver in one example is capable of: forming the output bit stream B(i) by assigning A(k) to B(i), k=0, 1, 2, . . . , $N_{CBPS} \times N_I$−1; and forming the output bit stream of $N_I$ OFDM symbols by sequentially assigning $N_{CBPS}$ data bits from the bit stream B(i) to each of the OFDM symbols, wherein any two adjacent A(k) bits are assigned to separate OFDM symbols and any two adjacent A(k) bits are separated by at least $N_{row}/N_{BPSC}$ subcarriers in the output OFDM symbols. In the examples here, $N_I$ can be a number of no less than two. Additionally, data bits in the output bit stream corresponding to adjacent subcarriers in one OFDM symbol may be separated by at least $N_I \times N_{column}$ bits. And two or more antennas may be used for providing two or more channels.

In addition to a system implementation, a method for transmitting information in a wireless communication system is also provided. The method may be implemented through a combination of hardware and software or firmware, or through a combination of processing devices, logics, and other circuitry. In one example, the method may include: receiving an input data for transmission; encoding input data to generate an input bit stream comprising a plurality of encoded data bits; and interleaving the encoded data bits to generate an output bit stream comprising a plurality of output data bits for transmission through at least two channels in at least two OFDM symbols. In one example, the interleaving of the encoded data bits may include: assigning two adjacent bits of the input bit stream to two bits of the output bit stream corresponding to two separate OFDM symbols; and assigning two adjacent bits of the input bit stream to two bits of the output bit stream corresponding to two separate subcarriers.

In some examples, the interleaving of the encoded data bits may be designed to assign any two adjacent bits of the input bit stream to two bits of the output bit stream corresponding to two separate OFDM symbols; and to assign any two adjacent bits of the input bit stream to two bits of the output bit stream corresponding to two separate subcarriers. In one example, the interleaving operation may include assigning the encoded data bits to the output data bits using a three-dimensional block to identify the separation of adjacent bits to separate OFDM symbols and separate subcarriers. FIG. 4b and the additional figures described below provide different examples of a three-dimensional block that may be used. Various three-dimensional blocks may be used depending on the system or transmission configuration.

In one example, the method is for an OFDM-based MIMO system and is to convert the input bit stream having data bits $A(k), k=0, 1, 2, \ldots N_{CBPS} \times N_I - 1$, into the output bit stream of $N_I$ OFDM symbols, wherein each OFDM symbol has $N_{CBPS}$ bits and $N_{SC}$ subcarriers and each subcarrier includes $N_{BPSC}$ bits. In one example, the interleaving of the encoded data bits may include: selecting two design parameters $N_{row}$ and $N_{column}$, wherein $N_{row} \times N_{column} = N_{CBPS}$; forming the output bit stream $B(i)$ by assigning $A(k)$ to $B(i), k=0, 1, 2, \ldots, N_{CBPS} \times N_I - 1$; and forming the output bit stream of $N_I$ OFDM symbols by sequentially assigning $N_{CBPS}$ data bits from the bit stream $B(i)$ to each of the OFDM symbols. In one example, any two adjacent $A(k)$ bits are assigned to separate OFDM symbols and any two adjacent $A(k)$ bits are separated by at least $N_{row}/N_{BPSC}$ subcarriers in the output OFDM symbols. In the examples here, $N_I$ can be a number of no less than two. In one example, the data bits in adjacent subcarriers in an OFDM symbol may be separated by at least $N_I \times N_{column}$ bits in the input stream $A(k)$. Additionally, two or more antennas may be used to provide two or more channels for transmission.

FIGS. 5a and 5b illustrate an exemplary mapping for an interleaver for four QPSK modulated OFDM symbols according to an embodiment of the present invention. Due to the QAM nature of the data, each symbol has a size of 16×6 encoded bits. In a system having 48 subcarriers per OFDM symbol, each symbol corresponds to one OFDM symbol having 48 subcarriers with 2 encoded bits, i.e., 48×2 encoded bits, since each QPSK sample contains two encoded bits for each subcarrier. Each column has 6 bits, which is equivalent to three adjacent subcarriers. As illustrated by the shading in FIG. 5a, arbitrary consecutive bits A(k) and A(k+1) are QPSK modulated in different OFDM symbols (corresponding to different antennas) and the separation is three subcarriers in frequency domain.

Figures 6A, 6B:
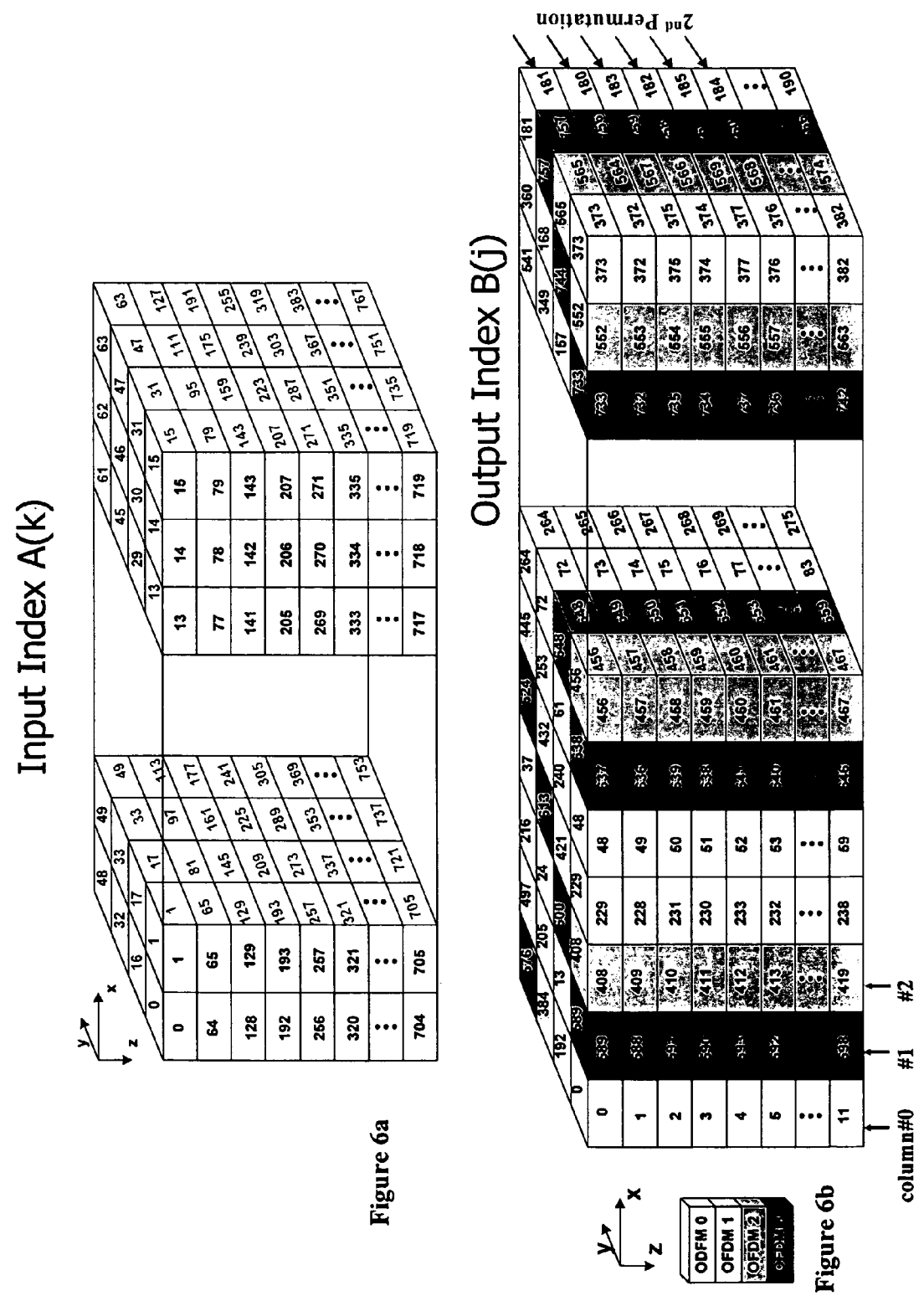

FIGS. 6a and 6b illustrate an exemplary mapping for an interleaver for four 16QAM modulated OFDM symbols according to an embodiment of the present invention. In this case, the size of each slice is 16×12 bits. Because each 16QAM sample comprises four encoded bits for each subcarrier, in a system having 48 subcarrier per OFDM symbol, each slice corresponds to one OFDM symbol having 48 subcarriers with 4 encoded bits, i.e., 48×4 encoded bits. Each column has 12 bits or equivalent to three subcarriers. As above, FIG. 6a-b illustrate that arbitrary consecutive bits A(k) and A(k+1) are 16QAM modulated in different OFDM symbols (antennas) and the separation is exactly three subcarriers in frequency domain.

In addition, because the system having the mapping presented in FIG. 6a-b uses a higher order modulation than QPSK, a $2^{nd}$ permutation (described above) is applied to swap the Most-Significant-Bit (MSB) and Least-Significant-Bit (LSB) of subcarriers on even columns. For example, after application of the second permutation, the interleaver outputs of the column#1 of the $1^{st}$ slice are B(589), B(588), B(591), B(590), B(593), B(592), . . . , etc. Without the $2^{nd}$ permutation, the interleaver outputs of the column#1 of the $1^{st}$ slice would have been B(588), B(589), B(590), B(591), B(592), B(593), . . . , etc.

Figure 7A:
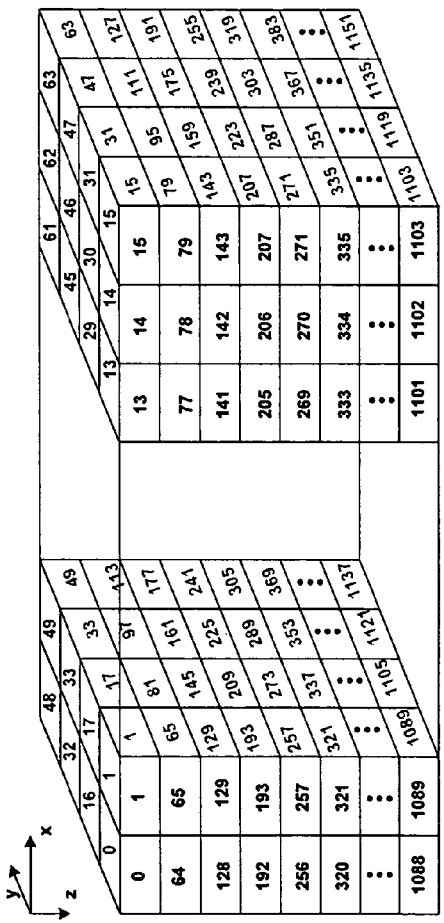
FIGS. 7a and 7b illustrate an exemplary interleaver mapping for an interleaver for four 64QAM modulated OFDM symbols according to an embodiment of the present invention.
Figure 7B:
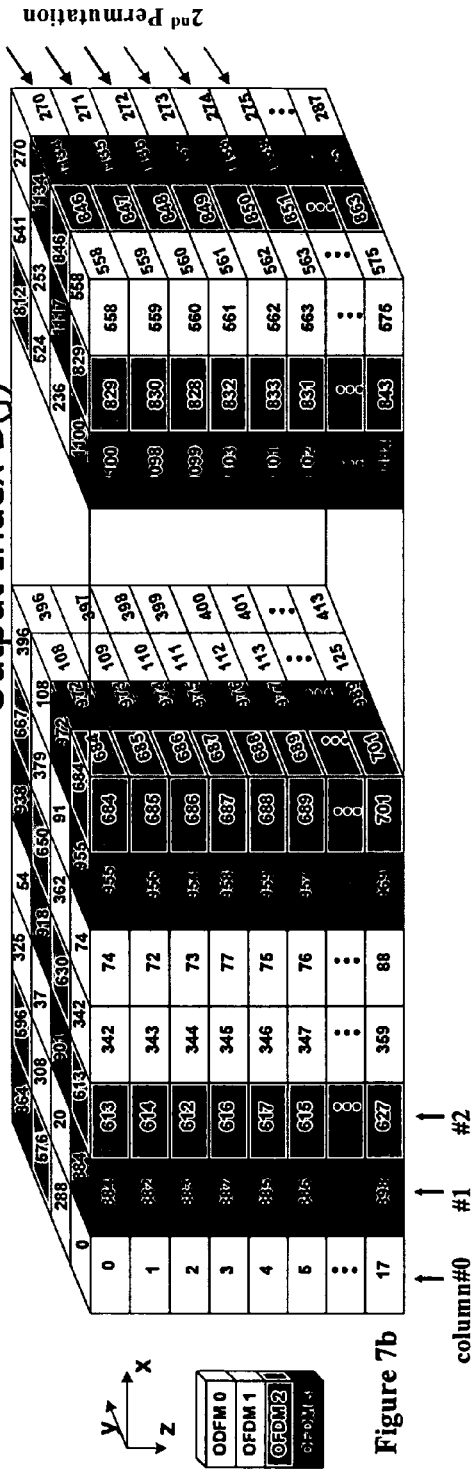

FIGS. 7a and 7b provide an exemplary mapping for an interleaver for four 64QAM modulated OFDM symbols. In the case of 64QAM, 6 bits are encoded for each subcarrier of the OFDM symbol. Consequently, the corresponding size of each slice is 16×18 bits. In a system having 48 subcarriers per OFDM symbol, there are 48×6 encoded bits per OFDM symbol. Each column has 18 bits, which is equivalent to three subcarriers. Arbitrary consecutive bits A(k) and A(k+1) can be 64QAM modulated in different OFDM symbols (antennas), and the separation is three subcarriers in frequency domain. In addition, the $2^{nd}$ permutation is applied to swap the MSBs and LSBs of subcarriers on the column numbers which are not an integer multiple of three, e.g., columns #1,#2,#4,#5,#7,#8,#10,#11,#13, and #14. For example, the interleaver outputs of the column#1 of the $1^{st}$ slice are B(884), B(882), B(883), B(887), B(885), B(886), . . . , etc. Without the $2^{nd}$ permutation, the interleaver outputs of the column#1 of the $1^{st}$ slice would have been B(882), B(883), B(884), B(885), B(886), B(887), . . . , etc.

Each column in FIGS. 4a-b, 5a-b, 6a-b and 7a-b may have encoded bits exactly equivalent to three subcarriers. The $2^{nd}$ permutations on 16QAM or 64QAM OFDM symbols are equivalent to those found in an 802.11g or 802.11a system.

Equations (3) and (4) define exemplary input and output indices for a generalized 3D interleaver for use in MIMO systems according to an embodiment of the present invention:

First Permutation Rule—Equation (3)

$$i = N_{CBPS}\left[\left\{\left(\text{floor}\left(\frac{k}{N_{column}}\right)\text{mod}(N_I)\right) - (k\,\text{mod}(N_{column}))\right\}\text{mod}(N_I)\right] + \frac{N_{CBPS}}{N_{column}}(k\,\text{mod}(N_{column})) + \text{floor}\left(\frac{k}{N_{column}N_I}\right) \quad (3)$$

where $k=0, 1, \ldots, N_{CBPS} \times N_I - 1$.

Second Permutation Rule—Equation (4)

$$j = N_{CBPS}\left[\text{floor}\left(\frac{i}{N_{CBPS}}\right)\right] + s \cdot \left[\text{floor}\left(\frac{i\,\text{mod}(N_{CBPS})}{s}\right)\right] + \left[ \quad (4)$$

-continued $$(i \bmod(N_{CBPS})) + N_{CBPS} - \text{floor}\left\{\frac{N_{column}\,(i\bmod(N_{CBPS}))}{N_{CBPS}}\right\}\right] \bmod(s)$$

where
$s=\max(N_{BPSC}/2,1)$ and $i=0, 1, \ldots, N_{CBPS} \times N_I - 1$. Further, in Equations (3) and (4):
$N_I$=number of OFDM symbols=width of 3D interleaver,
$N_{column}$=number of columns=length of 3D interleaver,
$N_{row}=N_{CBPS}/N_{column}$=number of rows=height of 3D interleaver,
$N_{SCPC}=N_{row}/N_{BPSC}$=number of subcarriers in one column,
$N_{CBPS}=N_{row} \times N_{column}$=number of bits per OFDM symbol, and
$N_{SC}=N_{SCPC} \times N_{column}$=number of subcarriers per OFDM symbol.

The corresponding 3D de-interleaver for a receiver to reverse the interleaver operations at transmitter in order to decode the un-interleaved data bits is given as follows:

First De-Interleave Rule:

$$j = N_{CBPS} \times \text{floor}\left(\frac{i}{N_{CBPS}}\right) + s \times \text{floor}\left(\frac{i \bmod N_{CBPS}}{s}\right) + \Bigl[$$
$$(i \bmod N_{CBPS}) + N_{CBPS} - \text{floor}\left\{\frac{N_{column} \times (i \bmod N_{CBPS})}{N_{CBPS}}\right\}\Bigr] \bmod s$$

where $s=\max(N_{BPSC}/2,1)$ and $i=0, 1, \ldots, N_{CBPS} \times N_I - 1$.
Second De-Interleave Rule:

$$N_{row} = \frac{N_{CBPS}}{N_{column}}$$

$$X = \text{floor}\left(\frac{i}{N_{row}}\right) \bmod N_{column};$$

$$Y = \left[\text{floor}\left(\frac{i}{N_{CBPS}}\right) + X\right] \bmod N_I;$$

$$Z = i \bmod N_{row}$$

$$k = X + Y \cdot N_{column} + Z \cdot (N_I \cdot N_{column})$$

where $i=0, 1, \ldots, N_{CBPS} \times N_I - 1$.

Exemplary MIMO system configurations include:
(a) Arbitrary number of antennas corresponding to number of simultaneously transmitted OFDM symbols. For example, such a system can have two, three, four, or more antennas.
(b) Various number of total available subcarriers. For example, a 20 MHz bandwidth MIMO system may have only 48 data subcarriers, and a 40 MHz bandwidth MIMO system may have 108 subcarriers.
(c) Various OFDM symbol modulations. For example, such modulation can be QAM modulations such as BPSK, QPSK, 16QAM, 64QAM, . . . , etc.

Figure 8A:
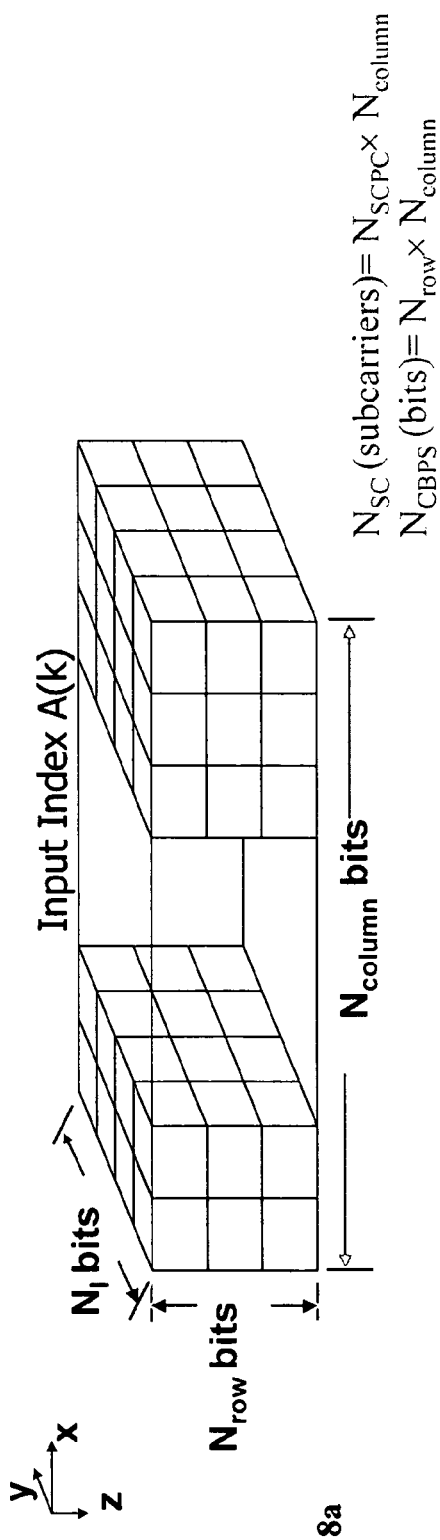
FIGS. 8a and 8b illustrate an exemplary mapping for a generalized 3D interleaver according to an embodiment of the present invention.
Figure 8B:
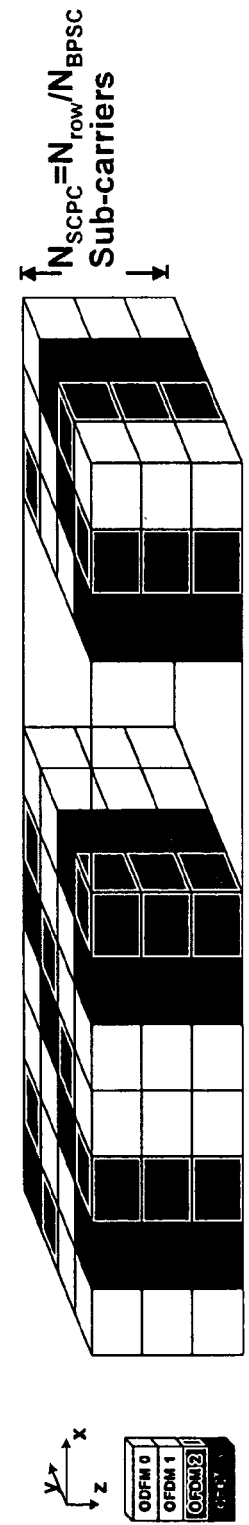
Figure 9:
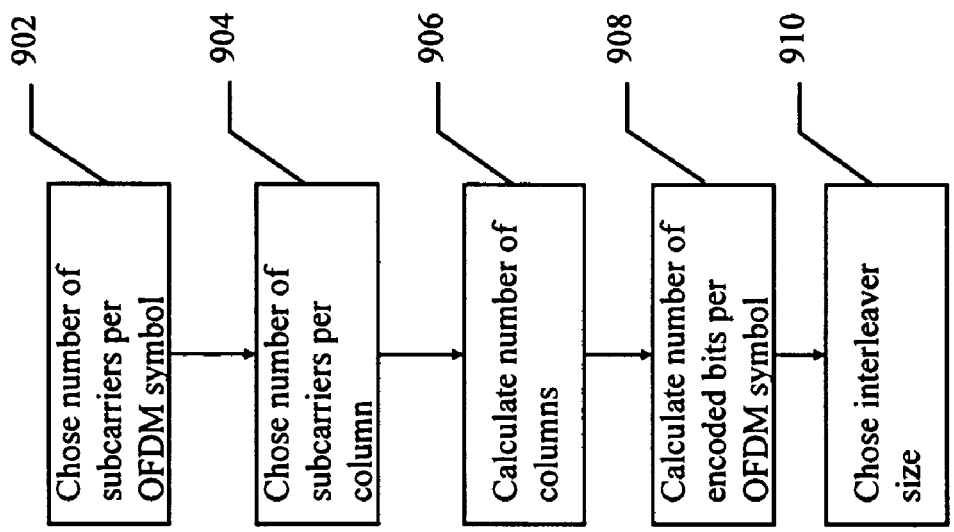
FIG. 9 is a flow chart for designing a generalized interleaver according to an embodiment of the present invention.

FIGS. 8*a-b* illustrate a mapping for a generalized 3D interleaver according to an embodiment of the present invention. FIG. 9 is a flow chart for a method for designing a general 3D interleaver according to an embodiment of the present invention. In step 902, the total number of subcarrier per OFDM symbol, $N_{SC}$ is chosen. In step 904, the number of subcarriers per column, $N_{SCPC}$, is chosen. $N_{SCPC}$ corresponds to the separation (in subcarriers) of consecutive encoded bits, A(k) and A(k+1). $N_{SC}$ and $N_{SCPC}$ are the design parameters which can be chosen to optimize the system performance in various MIMO configurations. For example, the choice can be by user input, automatic generation, a pre-determined quantity or a combination of these. In step 906, the number of columns, $N_{column}$ is calculated as $N_{column}=N_{SC}/N_{SCPC}$. For the exemplary interleavers corresponding to FIGS. 4*a-b*, 5*a-b*, 6*a-b* and 7*a-b*, $N_{SC}$, $N_{SCPC}$, and $N_{column}$ have the values 48, 3, and 16, respectively. In step 908, the total number of encoded bits per OFDM symbol, $N_{CBPS}$, is calculated as $N_{CBPS}=N_{BPSC} \times N_{SC}=N_{row} \times N_{column}$, where $N_{row}=N_{BPSC} \times N_{SCPC}$ is the number of bits in one column. Each slice is one OFDM symbol containing $N_{SC}$ subcarriers or $N_{CBPS}$ encoded bits. For example, integer numbers $N_{CBPS}$, $N_{BPSC}$, $N_{row}$, and $N_{column}$ are 48, 1, 3, and 16, respectively, in FIGS. 4*a-b* (BPSK); 92, 2, 6 and 16 in FIGS. 5*a-b*(QPSK); 192, 4, 12 and 16 in FIGS. 6*a-b* (16QAM); and 288, 6, 18 and 16 in FIGS. 7*a-b* (64QAM). In step 910, the interleaver size, $N_I$, is chosen. For example, the choice can be by user input, automatic generation, a pre-determined quantity or a combination of these. The resulting interleaver is an $N_{column}$(bits)$\times N_{row}$(bits)$\times N_I$(bits), 3 dimensional block interleaver as shown in FIGS. 8*a-b*.

Such a 3D interleaver designed in accordance with the present invention can include one or more of the following advantages:
(s1)—The separation of encoded bits in the same subcarrier but different OFDM symbols (antennas) is guaranteed to be $N_{column}$ bits. For example, SC#0 of OFDM symbols #0, #1, #2, and #3 are A(0), A(16), A(32), and A(48), respectively when $N_{column}$=16 in FIGS. 4*a-b*, 5*a-b*, 6*a-b* and 7*a-b*.
(s2)—The separation of consecutive bits A(k) and A(k+1) is guaranteed to be $N_{SCPC}$ subcarriers in frequency domain. Also, bits A(k) and A(k+1) are guaranteed to be in different OFDM symbols. For examples, bits A(k) and A(k+1) are QAM modulated to different OFDM symbols as shown by different gray shades in FIGS. 4*b*, 5*b*, 6*b* and 7*b*.
(s3)—The separation of encoded bits in consecutive subcarriers of the same OFDM symbol is guaranteed to be $N_I \times N_{column}$ bits. For example, bits B(0)=A(0), B(1)=A(64), B(2)=A(128) correspond to SC#0, SC#1, and SC#2 of OFDM symbol #0 in FIG. 4*b*. The separation between SC#0 and SC#1 of OFDM symbol#0 is 64 or $N_I \times N_{column}$=4×16 bits.

The three guaranteed separations (s1)-(s3) are key separations in a MIMO system. Separations (s1)-(s3) correspond to the coordinates x, y, and z in a proposed 3D interleaver block. For a specified MIMO system with $N_I$ OFDM symbols and $N_{SC}$ subcarriers per OFDM symbol, the randomness of encoded bits A(k) can be maximized by choosing proper separations in (s1)-(s3). For example, in embodiments of the present invention, one or more of the following features may be included:
(1) The three guaranteed separations (s1)-(s3) are applicable to all QAM modulations including BPSK, QPSK, 16QAM, 64QAM, and 256QAM. The primary difference of various QAM modulations relate to the bit size of the 3D interleaver. All separations are based upon the physical meaning of the coordinates x, y, and z.
(2) The three guaranteed separations (s1)-(s3) are applicable to various total available frequency bandwidth, e.g., 20 MHz, and 40 MHz. Also, they are applicable to arbitrary number of antennas. For example, if a MIMO system with 4 antennas is operating in a 40 MHz bandwidth containing 108 data subcarriers, a 9×12×4, 3D interleaver block which has 12 columns and a 9-subcarrier separation between consecutive encoded bits can be chosen. Another option is a 12×9×4, 3D interleaver block having 9 columns and a 12-subcarrier separation between consecutive encoded bits A(k) and A(k+1). The difficulty of designing an optimal interleaver depends in part upon the required separations in space, frequency and time from communication theories according to the selected convolutional codes in the specified MIMO multipath channels. However, it is desirable that such an optimal interleaver is required to guarantee the above three separations (s1)-(s3) and provide sufficient randomness of all available diversities. For example, through simulation, it is found that once a set of three proper separations (s1)-(s3) is chosen, further random permutations applied on the generalized 3D interleaver provide negligible or no improvement in system performance.

Another type of 3D interleaver that can be derived based upon the generalized 3D interleaver described above is called a 3D-A interleaver. FIG. 10 is a schematic diagram of a 3D-A interleaver according to an embodiment of the present invention. Equation (5) and (6) provide the permutation rules for a generalized 3D-A interleaver according to an embodiment of the present invention. A 3D interleaver designed using Equations (5) and (6) guarantees separation of consecutive coded bits is $N_{SCPC}$ subcarriers. The guaranteed separation of coded bits in consecutive subcarriers is $N_I \times N_{column}$ bits.

First Permutation Rule—Equation (5)

$$x = k \bmod (N_{column}); \quad (5)$$

$$y = \text{floor}\left(\frac{k}{N_{column}}\right) \bmod (N_I);$$

$$z = \text{floor}\left[\left(\frac{k}{N_{column} N_I}\right) + Y \cdot N_{BPSC}\right] \bmod \left(\frac{N_{CBPS}}{N_{column}}\right);$$

$$i = Z + X \cdot \left(\frac{N_{CBPS}}{N_{column}}\right) + N_{CBPS} \cdot ((Y - X) \bmod (N_I))$$

where X, Y and Z are defined above, and k=0, 1, ..., $N_{CBPS} \times N_I - 1$.

Second Permutation Rule—Equation (6)

$$j = N_{CBPS}\left[\text{floor}\left(\frac{i}{N_{CBPS}}\right)\right] + \quad (6)$$

$$s \cdot \left[\text{floor}\left(\frac{i \bmod (N_{CBPS})}{s}\right)\right] + \left[(i \bmod (N_{CBPS})) + \right.$$

$$\left. N_{CBPS} - \text{floor}\left\{\frac{N_{column} \cdot (i \bmod (N_{CBPS}))}{N_{CBPS}}\right\}\right] \bmod (s)$$

where s=max($N_{BPSC}$/2,1) and i=0, 1, ..., $N_{CBPS} \times N_I - 1$.

The corresponding 3D-A de-interleaver for a receiver to reverse the interleaver operations at transmitter in order to decode the un-interleaved data bits is given as follows:

First De-Interleave Rule:

$$j = N_{CBPS} \times \text{floor}\left(\frac{i}{N_{CBPS}}\right) + s \times \text{floor}\left(\frac{i \bmod N_{CBPS}}{s}\right) + \left[\right.$$

$$\left. (i \bmod N_{CBPS}) + N_{CBPS} - \text{floor}\left\{\frac{N_{column} \times (i \bmod N_{CBPS})}{N_{CBPS}}\right\}\right] \bmod s$$

where s=max($N_{BPSC}$/2,1) and i=0, 1, ..., $N_{CBPS} \times N_I - 1$.

Second De-Interleave Rule:

$$N_{row} = \frac{N_{CBPS}}{N_{column}}$$

-continued $$X = \text{floor}\left(\frac{i}{N_{row}}\right) \bmod N_{column};$$

$$Y = \left[\text{floor}\left(\frac{i}{N_{CBPS}}\right) + X\right] \bmod N_I;$$

$$Z = i \bmod N_{row}$$

$$k = X + Y \cdot N_{column} + [(Z - Y * N_{BPSC}) \bmod N_{row}] \cdot (N_I \cdot N_{column})$$

where i=0, 1, ..., $N_{CBPS} \times N_I - 1$

A generalized 3D-A interleaver as defined above may provide one or more of the following advantages:

(a) The three guaranteed separations in (s1)-(s3) are generally satisfied in most applications in communication systems. However, a set of proper three separations may have to be determined from simulation (or field-testing) results for a specified number of subcarriers $N_{SC}$. For example, if $N_{SC}$ is 48, there may be two options: (1) 3 subcarrier×16 columns, or (2) 4 subcarriers×12 columns. Although both may provide good system performance according to simulation results, their performances can differ in some particular simulation settings. That is, options (1) and (2) may have different properties. For example, option (1) may have a larger separation in frequency domain between A(k) and A(k+1) than option (2) but option (2) may have a larger separation than option (1) of encoded bits in the same subcarrier of different OFDM symbols according to the guaranteed separation (s1).

(b) In addition, the three guaranteed separations are generally satisfied unless the separation (s1) if $N_{column}$ is too small in which case separation (s1) may not be sufficient. For example, if $N_{SC}=54$, the proper choice of $N_{column}$ is either 6, or 9. That implies the separation of encoded bits in the same subcarrier of different OFDM symbols is either 6 bits or 9 bits. Both are not large enough to separate the correlations of encoded bits. This is the major concern to generalize the original 3D interleaver to 3D-A interleaver which not only increases the separation (s1) but also preserves the guaranteed separations (s2) and (s3).

Figure 13A:
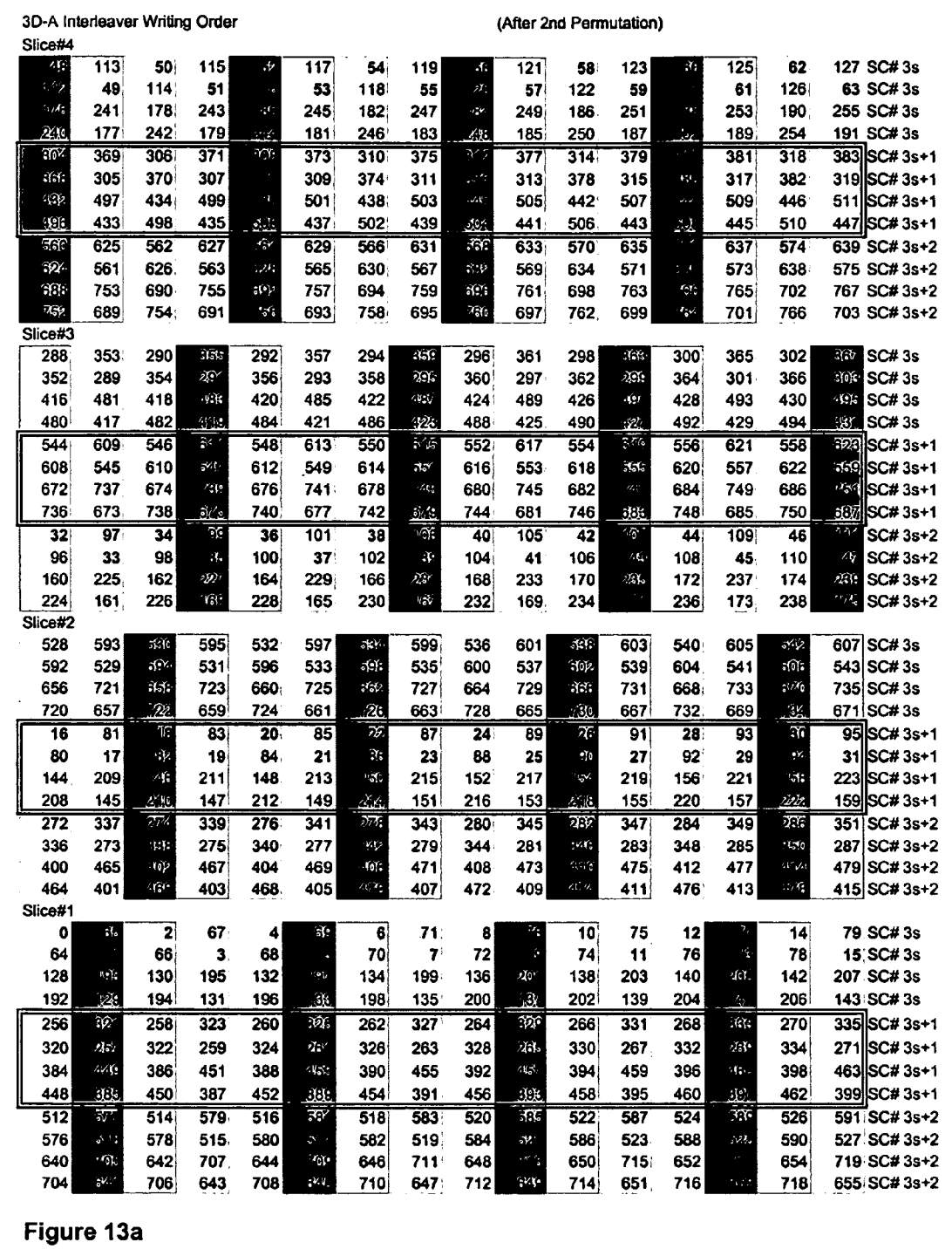

In one embodiment of the present invention, for example, the difference between the interleaver 3D and 3D-A may include the writing orders shown in the FIG. 13a. The reading order may be the same for both interleavers 3D and 3D-A. In one example, after writing the 1st $N_{column}$ bits in 3D cells marked as A's, the next $N_{column}$ bits are written in the cells marked as B's. The overall writing order for a 3D interleaver is described as A→J→G→D→E→B→K→H→I→F→C→L. However, the overall writing order for a 3D-A interleaver is described as A→B→C→D→E→F→G→H→I→J→K→L. For a clear comparison, examples of writing order for both a 3D and a 3D-A interleaver for a MIMO system with $N_{SC}=48$, $N_I=4$, and $N_{column}=16$ are shown in FIGS. 11a-b, 12a-b, 13a-b and 14a-b.

Figure 11A:
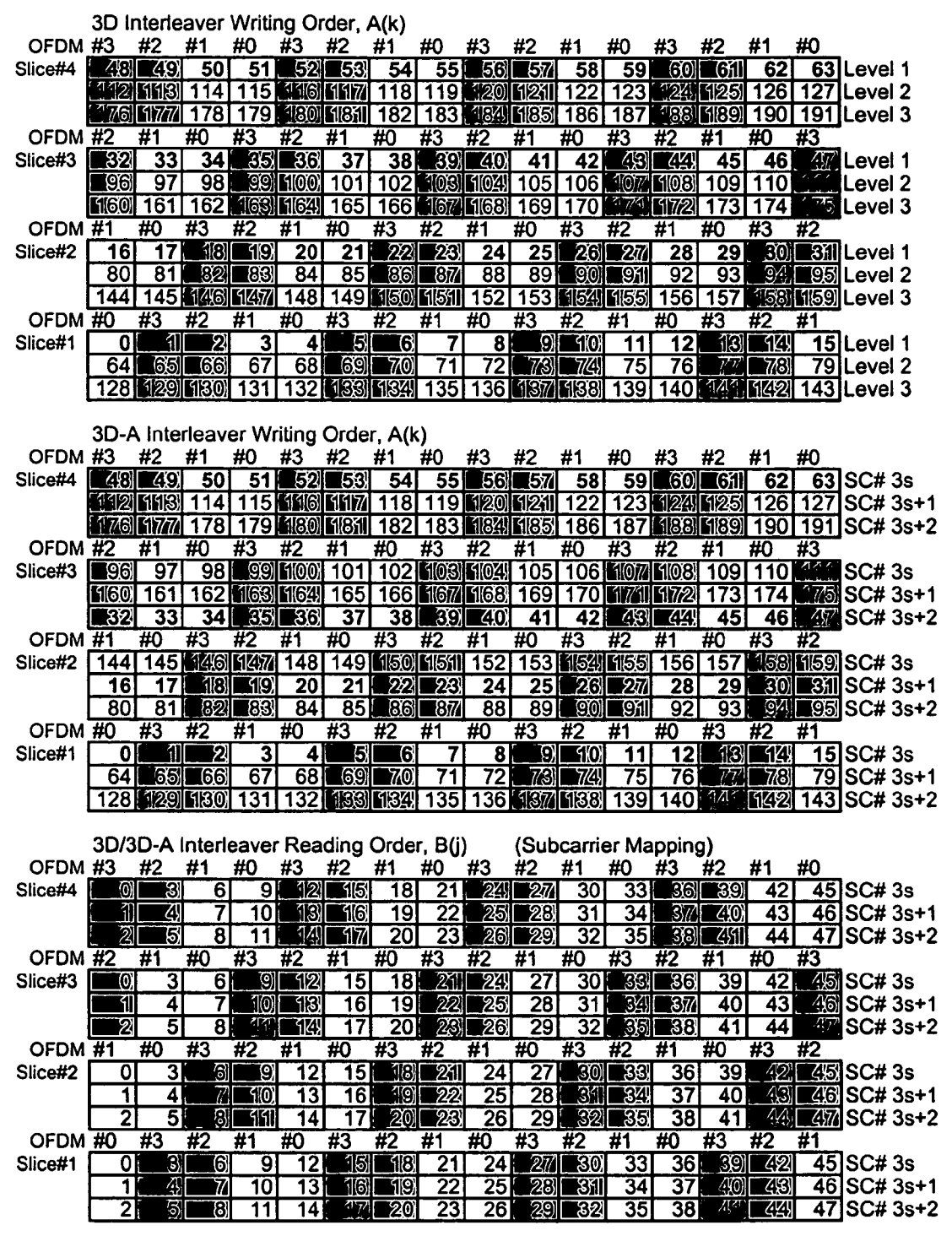

FIG. 11a compares an example of the writing and reading orders of a 3D interleaver with a 3D-A interleaver according to an embodiment of the present invention. One 3D or 3D-A interleaver may include four vertical slices, #1, #2, #3, and #4. In addition, levels 1, 2, and 3 represent the top, middle, and bottom levels as shown in the FIGS. 4a-b and 11a-b. In one example, level 1 contains the 1st rows of slices #1, #2, #3, and #4. A generalized 3D-A interleaver may write the memory from Level 1 to Level 3. And a generalized 3D-A interleaver may write the memory circularly from subcarriers ($3s+i$) of one slice to the next subcarriers ($3s+i+1$) of the next slice. The subcarriers of four OFDM symbols (interleaver outputs) are illustrated in different gray shades in FIGS. 11a-b. Implementation of a 3D or 3D-A interleaver according to one embodiment of the present invention includes taking each encoded bits A(k) from the CE and sending it to the specified subcarrier of the specified OFDM symbol. In other words, every bit taken from a CE may be hard-wired to the predetermined QAM mapper (subcarrier) and OFDM symbol without performing the mathematical operations by hardware from the given Equations (3)-(6).

FIG. 11b illustrates an example of the resulting difference of the proposed 3D and 3D-A interleavers. The 16-bit separation of different OFDM symbols on the same subcarrier is found in a 3D interleaver, e.g., A(0), A(16), A(32), and A(48) of SC#0. This separation may be sufficient in most cases, but it may be insufficient if $N_{column}$ is small, e.g., $N_{column}$=6. The same separation increases to 48 bits in a 3D-A interleaver, e.g., A(0), A(144), A(96), and A(48). This increased separation is achieved by looking at the neighborhoods shown in FIG. 10a. For example, the encoded bits in the same subcarrier for a 3D interleaver are A's, J's, G's, and D's since the writing order is A→J→G→D. Therefore, the separation between two consecutive OFDM symbols on the same subcarrier is only $N_{column}$ bits. On the other hand, the writing order for a 3D-A interleaver is A→B→C→D, i.e., A's, J's, G's, D's, are separated by more than one column. In addition, this increased separation is carefully designed for three adjacent subcarriers on the same column only.

In summary, while all subcarriers are transmitted from the same antennas for 3D and 3D-A interleavers, their writing order is different. For example, the written encoded bits of the slice#2 in FIG. 10a (3D-A) are J's, B's, and F's, from top (Level 1) to the bottom (Level 3). The written encoded bits will be B's, F's, and J's for a 3D interleaver as described with respect to FIGS. 4a-b.

Furthermore, a fixed rotation pattern for every 4×3 subcarriers found in FIG. 11b may be applied on the proposed 3D-A interleaver containing four OFDM symbols. For example, the permutations of SC#0 to SC#2 from interleaver 3D to 3D-A is the same as the permutations of SC#12 to SC#14 of OFDM symbols #0 to #3 from interleaver 3D to 3D-A. This periodic permutation is applied according to the number of OFDM symbols. A 3-subcarrier separation is found for two arbitrary consecutive encoded bits, A(k), and A(k+1), and a 64-bit separation is found between two arbitrary consecutive subcarriers, SC#s and SC#(s+1). Therefore, in one example interleaver 3D-A not only may increase the guaranteed separation (s1) but also may preserve the guaranteed separations (s2) and (s3).

FIGS. 12a and 12b illustrate 2 exemplary writing and reading orders for a 3D-A interleaver operating upon four QPSK modulated OFDM symbols according to an embodiment of the present invention. Each QPSK modulated subcarrier contains two encoded bits. For example, after writing the first 16 encoded bits, A(0) to A(15) in slice#1 on subcarriers $3s$, the next 16 bits are written in the subcarriers $3s+1$ (the $3^{rd}$ row) of the slice#2. FIG. 11b illustrates another example. Similarly, every bit taken from a CE can be hard-wired to the predetermined QAM mapper (subcarrier) and OFDM symbol. The three guaranteed separations (s1)-(s3) are preserved in the example illustrated in FIGS. 11a and 11b.

Figure 13B:
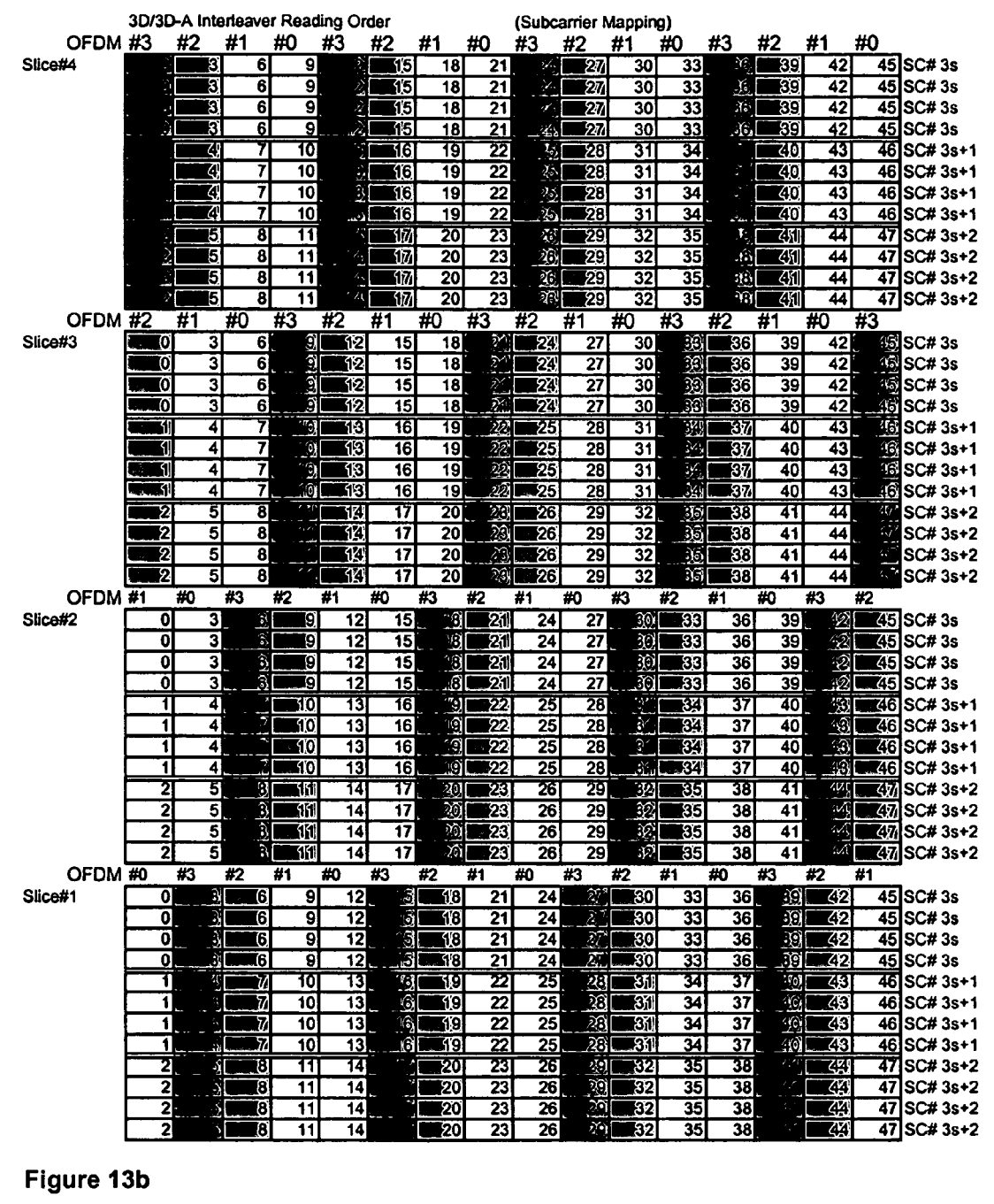

FIGS. 13a and 13b illustrate the writing and reading orders of a 3D-A interleaver operating upon four 16QAM modulated OFDM symbols according to an embodiment of the present invention. Each 16QAM modulated subcarrier contains four encoded bits. For example, after writing the first 16 encoded bits, A(0) to A(15) in slice#1 on subcarriers $3s$, the next 16 bits are written in the subcarriers $3s+1$ (the $5^{th}$ row) of the slice#2. Furthermore, the $2^{nd}$ permutation is applied on MSBs and LSBs. Therefore, non-consecutive numbers are present in FIG. 13a.

Figure 14A:
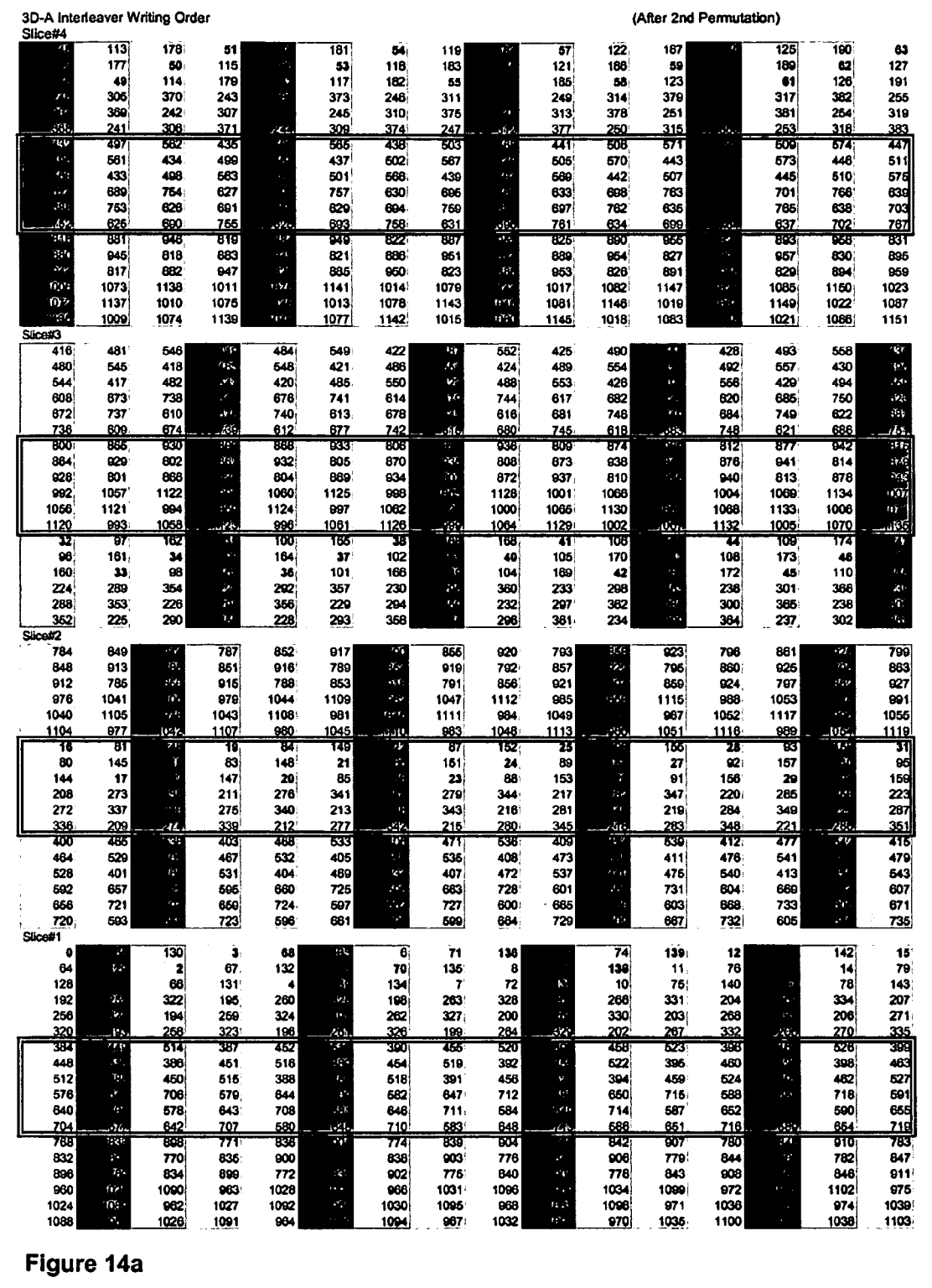
Figure 14B:
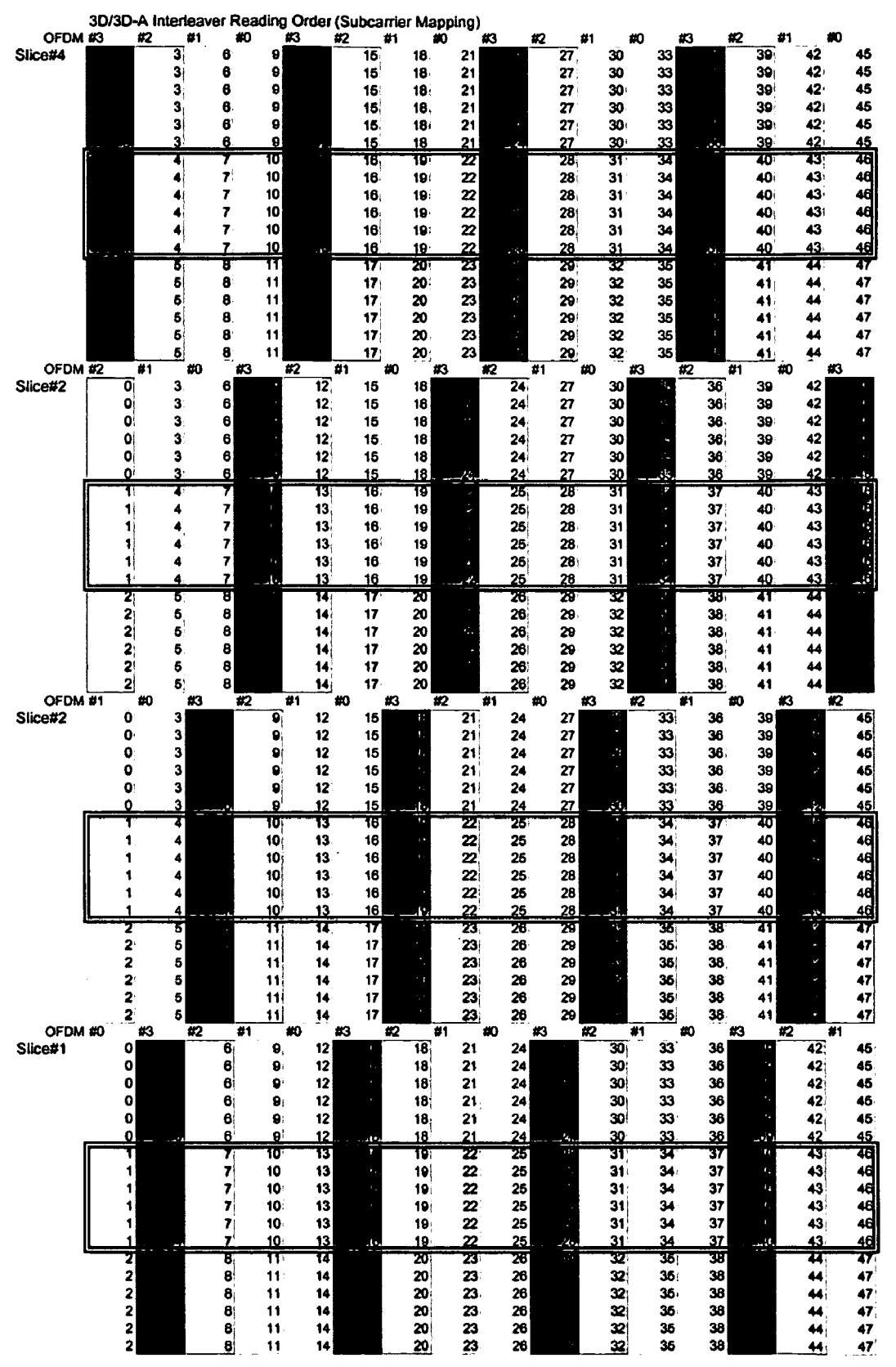

FIGS. 14a and 14b illustrate the writing and reading orders of a 3D-A interleaver containing four 64QAM modulated OFDM symbols according to an embodiment of the present invention. Each 64QAM modulated subcarrier contains six encoded bits. For example, after writing the first 16 encoded bits, A(0) to A(15) in slice#1 on subcarriers $3s$, the next 16 bits are written in the subcarriers $3s+1$ (the $7^{th}$ row) of the slice#2. Furthermore, the $2^{nd}$ permutation is applied on MSBs and LSBs. Therefore, non-consecutive numbers are present in FIG. 14a.

As described above, the guaranteed separations shown in FIGS. 11a-b, 12a-b, 13a-b and 14a-b of a 3D-A interleaver contain encoded bits for various QAM modulated OFDM symbols. Implementing a MIMO system according to embodiments of the present invention does not require any mathematical operations according to the given Equations of a 3D or 3D-A interleaver. The corresponding subcarrier and OFDM symbol of each encoded bit from the convolutional encoder are illustrated in FIGS. 11b, 12b, 13b and 14b. Each encoded bit may be hardwired directly to its defined subcarrier and OFDM symbol in the implementation. The methods to implement a 3D or 3D-A interleaver illustrated in FIGS. 11a-b, 12a-b, 13a-b and 14a-b ($N_f$=4, $N_{SC}$=48, and $N_{SCPC}$=3) can be generalized to arbitrary interleaver size of a 3D or 3D-A interleaver: arbitrary number of OFDM symbols (number of slices), arbitrary $N_{column}$, arbitrary $N_{SCPC}$ (or $N_{row}$).

Further permutations based on interleaver 3D or 3D-A described above are possible. Examples are provided in FIGS. 15a-b, 16a-b and 17. From the shading differences in FIGS. 4b, 5b, 6b and 7b, one may apply a reading or writing order for a 3D interleaver block such that different colors are shown on arbitrary two small cells on all facets or coordinates, i.e., planes x-y, x-z, and y-z. In one example, an exemplary simulation shows negligible or no improvement from further permutations than 3D-A interleaver. Other options based upon the generalized 3D or 3D-A interleavers may also be used. The proposed 3D block in one example may provide a tool for a designer to easily distribute the correlated encoded inputs into the three separations of a MIMO system.

FIGS. 15a-b illustrate a mapping for a 3D interleaver according to another embodiment of the present invention called a 3D-B1 interleaver. As shown in the example in FIG. 15, the writing order is A→B→C→ . . . →J→K→L, i.e., after finished all A's, then start to write all B's and so on. A variation may be applied on the reading order to make sure that different OFDM symbols are shown on all three facets, i.e., planes x-y, x-z, and y-z. The corresponding OFDM symbol number is marked on each output bit of FIG. 15b. Equal numbers of bits of each OFDM symbol may be uniformly distributed on all three facets. For example, for a 16×4×3 3D block containing four OFDM symbols, an exemplary number of bits for each OFDM symbol is given as follows.

(a) 3 bits for each OFDM symbol found on arbitrary cross-section of plane y-z which contains 4×3=12 bits.
(b) 16 bits for each OFDM symbol (one bit out of every four bits) found on arbitrary cross-section of plane x-y which contains 4×16=64 bits.
(c) 12 bits per OFDM symbol (three bits out of every four columns, i.e., total 3×4=12 bits) found on arbitrary cross-section of plane x-z which contains 3×16=48 bits.

An interleaver according to this embodiment of the present invention operates upon four OFDM symbols each having an OFDM symbol has equal share in each of three dimensions.

FIGS. 16a-b provide a mapping for a 3D interleaver according to another embodiment of the present invention called a 3D-B2 interleaver. An exemplary writing order for the 3D interleaver corresponding to FIG. 16a-b is A→B→C→ . . . →J→K→L, and the reading order is the same as described in FIGS. 15a-b. The physical meaning of this embodiment is to implement parallel 802.11a and 802.11g interleavers (one OFDM symbol per interleaver) from the writing order and to perform the circulation on OFDM symbols in reading order.

Figure 17:
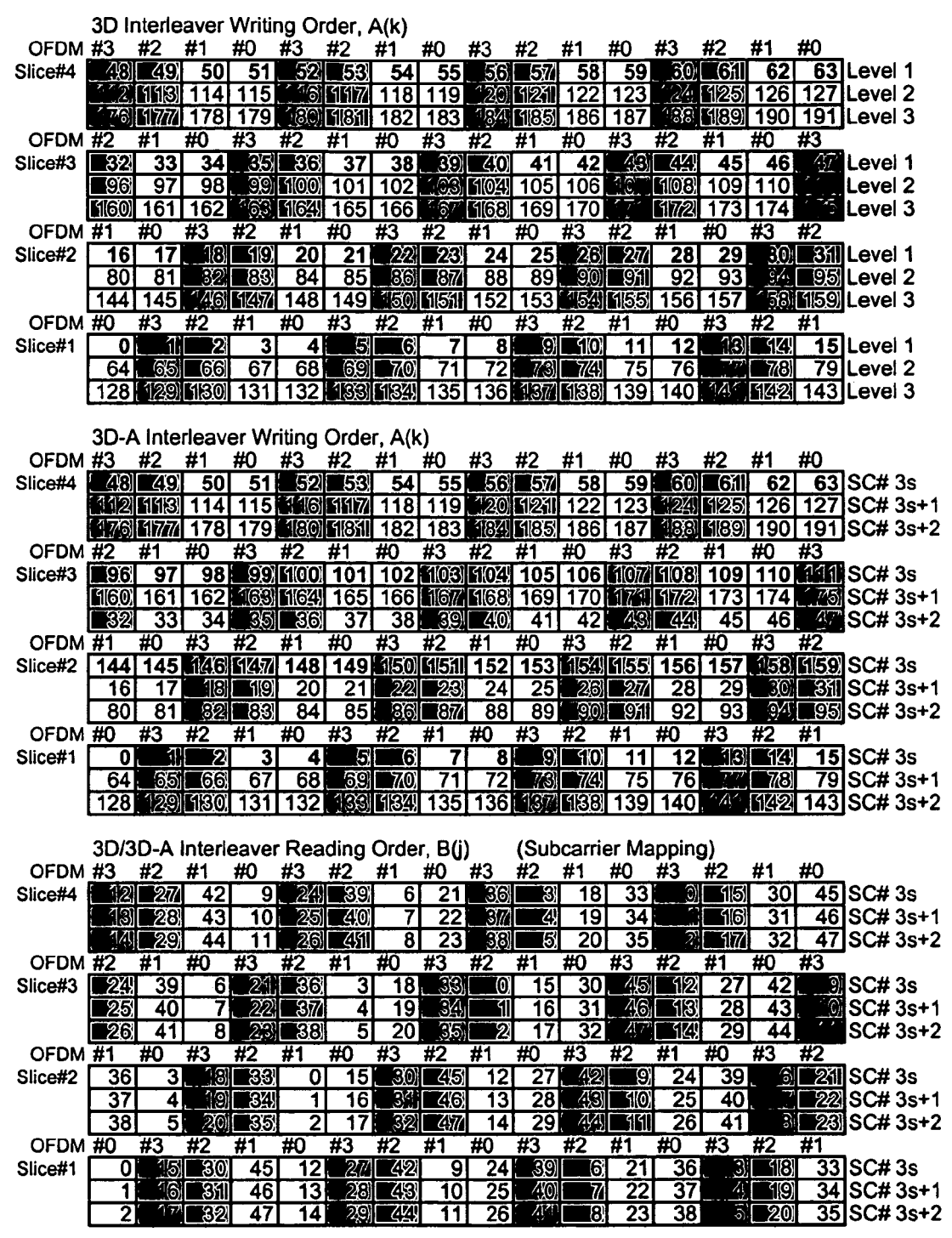

FIG. 17 illustrates a mapping corresponding to a 3D interleaver according to another embodiment of the present invention. The difference between FIG. 11a and FIG. 17 includes the reading order. The starting bit of each OFDM symbol is shifted (offset) 4 columns or one quarter of the total columns. This shift may be increased to 8 columns or one half of the total columns if the interleaver contains only two OFDM symbols. It is not required that this shift in subcarriers for each OFDM symbol is a constant or the starting bits of all OFDM symbols are equally separated. Another example is to use the reverse order in subcarriers on interleaver output, i.e., the subcarrier number is decreasing from left to right in the tables shown in FIGS. 14a-b, 15a-b, 16a-b or FIG. 17.

Many variations for implementing the 3D interleavers described above are possible, including:
(a) changing the writing orders of the interleavers corresponding to FIGS. 4-7, and 10-14.
(b) changing the reading orders of the interleavers corresponding to FIGS. 4-7, and 10-14.
(c) changing the starting point at an arbitrary small block (unit cell) illustrated in the FIGS. 4-7 and 10-14.

In addition to the 3D interleaver schemes discussed above, system performance can also be improved with circulation transmission (CT). Two methods of circulation transmissions (CTs) are introduced here. Furthermore, a MIMO system can implement a 3D interleaver or 3D-A interleaver with or without using circulation transmission. Likewise, a MIMO system can implement circulation transmissions with or without the 3D interleaver or 3D-A interleaver described above. However, improved system performance may be achieved by implementing a 3D interleaver or a 3D-A interleaver and circulation transmission.

As noted above, having multiple antennas does not guarantee successful transmission and receipt of data streams from all antennas simultaneously. Also, system performance may be improved if the same data streams are transmitted and received from all antennas. In cases where the number of simultaneously transmitted data streams ($N_{OFDM}$) is smaller than the number of transmitter antennas (M), the circulation transmissions can be applied to achieve best system performance. As noted above, a proposed 3D/3D-A interleaver containing $N_I$ OFDM symbols implies that a MIMO system may transmit $N_I$ OFDM symbols simultaneously from $N_I$ antennas. In cases where the circulation transmissions are implemented, the interleaver size may be either equal to $N_{OFDM}$ or an integer multiple of $N_{OFDM}$ OFDM symbols.

Figure 18A:
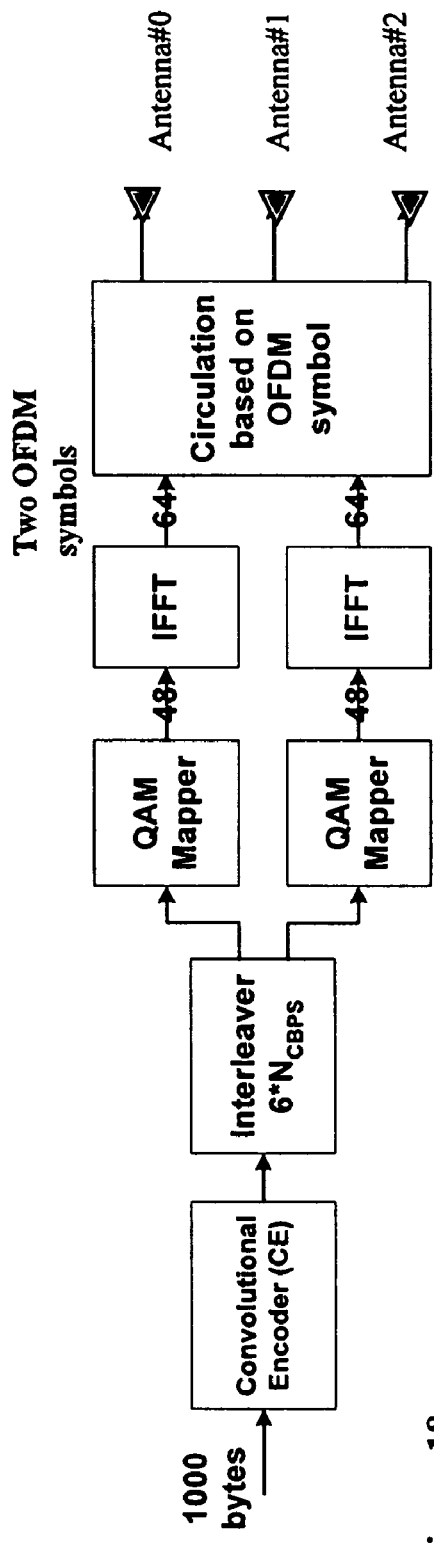
FIG. 18a is a schematic block diagram illustrating using symbol-based circulation in a Circular SMX MIMO system according to an embodiment of the present invention.
Figure 18B:
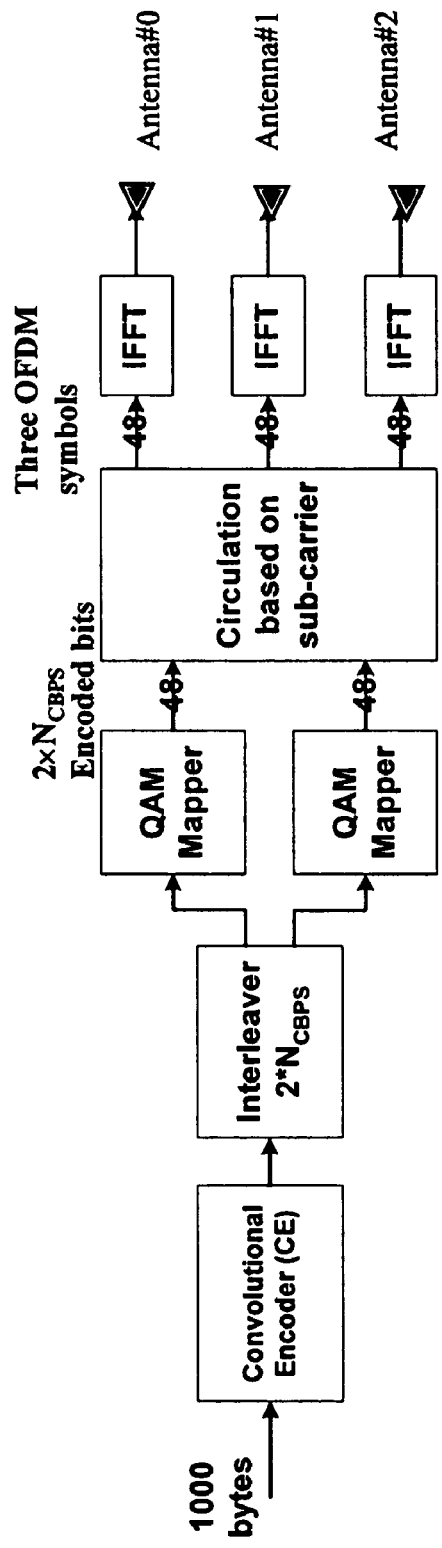
FIG. 18b is a schematic block diagram illustrating using subcarrier-based circulation in a Circular SMX MIMO system according to an embodiment of the present invention.

FIGS. 18a-b are schematic diagrams illustrating methods of circulation transmissions (with $N_{OFDM}=2$, and M=3) of a Circular Spatial Multiplexing (hereafter referred to as Circular SMX) MIMO system, 2(3) Circular according to embodiments of the present invention. The system of FIG. 18a performs a type of circulation transmission called OFDM symbol-based circulation (S_BC). As will be described in more detail below, in S_BC, a circulation pattern is defined for each OFDM symbol. The system of FIG. 18b performs a type of circulation transmission called subcarrier-based circulation (Sub_BC). As will be described in more detail below, in Sub_BC, a circulation pattern is defined for each subcarrier.

In FIG. 18a, only two out of three antennas transmit two OFDM symbols simultaneously. However, different pairs of antennas are selected to transmit different pairs of OFDM symbols at different times. For example, the first two OFDM symbols (#0 and #1) are transmitted by antennas #0 and #1, the OFDM symbols #2 and #3 are transmitted by antennas #0 and #2, and the OFDM symbols #4 and #5 are transmitted by antennas #1 and #2. Although only two OFDM symbols are transmitted simultaneously, it may be desirable to choose an interleaver containing six OFDM symbols, i.e., to evenly permute encoded bits for all transmitter antennas in a MIMO system.

System performance can be shown to be improved using such circulation transmission in comparison with a MIMO system transmitting two OFDM symbols from two fixed antennas. However, the benefits may come at a cost of increasing the interleaver size from two to six OFDM symbols. In addition to requiring more storage, a larger interleaver size generally incurs longer decoding delay because the receiver must pause the de-interleaving process until it receives all OFDM symbols (six in the present example). Such delay could be problematic in a MIMO system focusing on high data rate transmission (hundreds of Mbps).

The above-described example of S_BC circulation transmission employs a fixed antenna circulation pattern, i.e., antennas #0 and #1, #0 and #2, #1 and #2. This pattern is repeated until the last pair of OFDM symbols is transmitted. In one example, one complete antenna circulation pattern may require three pairs of transmission or six OFDM symbols. The total number of OFDM symbols is not required to be an integer multiple of six OFDM symbols, i.e., the transmission can stop after transmitting the last pair of OFDM symbols. Also, the total number of OFDM symbols is not required to be an even number. In this case, the last OFDM symbol can be transmitted by either one of the last pair of antennas.

FIG. 18b is a schematic diagram of a MIMO system that performs subcarrier-based circulation transmission to increase diversity according to an embodiment of the present invention. Two OFDM symbols from the interleaver outputs will be transformed into three OFDM symbols for three transmitters. In other words, encoded bits for 2×48 subcarriers are transmitted from 3×48 subcarriers simultaneously, i.e., three antennas. In this embodiment of the present invention, one third of the subcarriers are zeroes. The number of encoded bits (or number of non-zero subcarriers) transmitted simultaneously in the systems illustrated in FIGS. 18a and 18b is the same. However, in the subcarrier-based system of FIG. 18b, the interleaver size is greatly reduced from six to two OFDM symbols. Moreover, antenna diversity is guaranteed since all antennas are transmitting simultaneously.

An exemplary simulation shows significant performance improvements for both S_BC and Sub_BC when compared with a MIMO system transmitting two OFDM symbols from two fixed antennas. Furthermore, in almost all cases, the performances of both S_BC and Sub_BC are about the same from computer simulations, i.e., both methods achieve the same transmit diversity.

FIG. 19a illustrates exemplary circulation patterns for a S_BC system and a Sub_BC system according to embodiments of the present invention. FIG. 19b provides circulation patterns and interleaver sizes for the corresponding systems shown in FIG. 19a.

The number of circulation patterns is the number of possible choices to select $N_{OFDM}$ antennas out of total M antennas, i.e., $$N_{Pattern} = \binom{M}{N_{OFDM}} = \frac{M!}{N_{OFDM}!(M-N_{OFDM})!}.$$

According to one embodiment of the present invention, to guarantee that all transmitter antennas are included (with equal share) in the same interleaver, the interleaver size for a S_BC MIMO system is $N_{Pattern} \times N_{OFDM}$ OFDM symbols. The interleaver size of a corresponding Sub_BC MIMO system is only $N_{OFDM}$ OFDM symbols to guarantee the same transmit diversity as a S_BC MIMO system. For each $N_{OFDM}$ (M) MIMO system, each choice of $N_{OFDM}$ antennas is denoted as Pattern#0, #1, . . . , #($N_{Pattern}$–1). For example, there are three choices ($N_{Pattern}$=3) of antennas ($N_{OFDM}$ antennas each choice) for a 2 (3) CSMX system. These patterns are as follows:

Pattern#0: antennas #0 and #1;
Pattern#1: antennas #2 and #1; and
Pattern#2: antennas #2 and #0.

For an S_BC Circular SMX system, the $N_{OFDM}$ OFDM symbols are transmitted simultaneously according to the repeated Pattern #0, #1, . . . , #($N_{Pattern}$–1). The transmission stops at arbitrary Pattern #i, (i=0, 1, . . . , $N_{Pattern}$–1) when the last OFDM symbol is transmitted at this pattern. The last transmission may contain an arbitrary number of OFDM symbols j, from one to $N_{OFDM}$. The interleaver size is $N_{Pattern} \times N_{OFDM}$ OFDM symbols except the size for the last transmission is (i$\times N_{OFDM}$+j) OFDM symbols. These numbers can be determined from the total number of bits (or bytes) specified in the packet header at the beginning of each transmission. Thus, both the transmitter and the receiver can calculate these numbers from the packet header without extra information and implement the correct interleaving and de-interleaving processes.

Figures 20A, 20B:
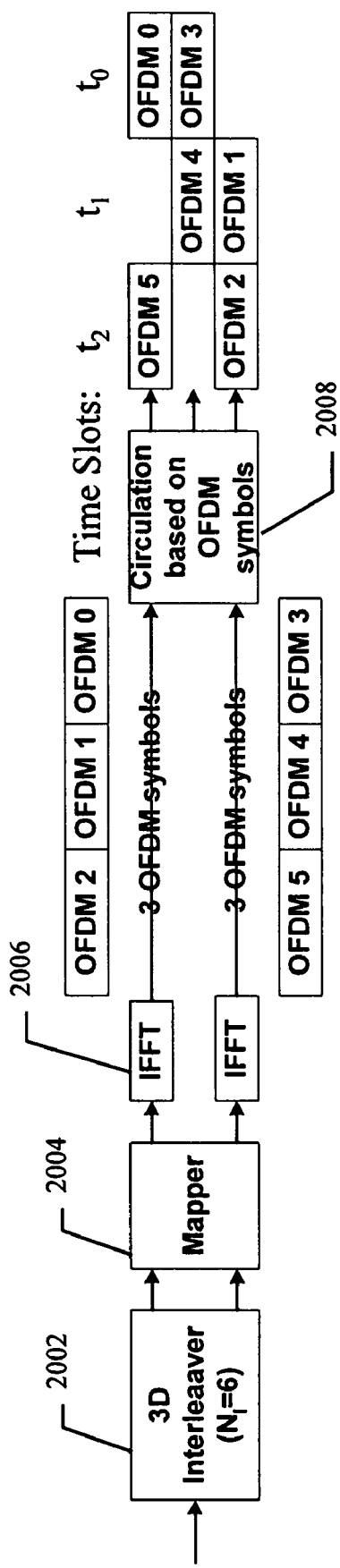

FIG. 20a is a schematic diagram of an exemplary 2 (3) S_BC Circular SMX system according to an embodiment of the present invention using data provided by the table of FIG. 19a. Data from a convolutional encoder (not shown) is fed to a 3D interleaver 2002. The interleaved data is mapped to subcarriers by mapper 2004. The mapped data is passed through a bank of IFFTs 2006. Circulation transmission based on OFDM symbols is provided by circulation unit 2008. FIG. 20b illustrates exemplary circulation patterns for use in the 2(3) S_BC Circular SMX system illustrated in FIG. 20a.

The interleaver size is $N_{Pattern} \times N_{OFDM}$ or six OFDM symbols as listed in the table in FIG. 19b. These six OFDM symbols are transmitted according to Patterns, #0, #1, and #2, in three time slots, $t_0$, $t_1$, and $t_2$, respectively.

Figure 21A:
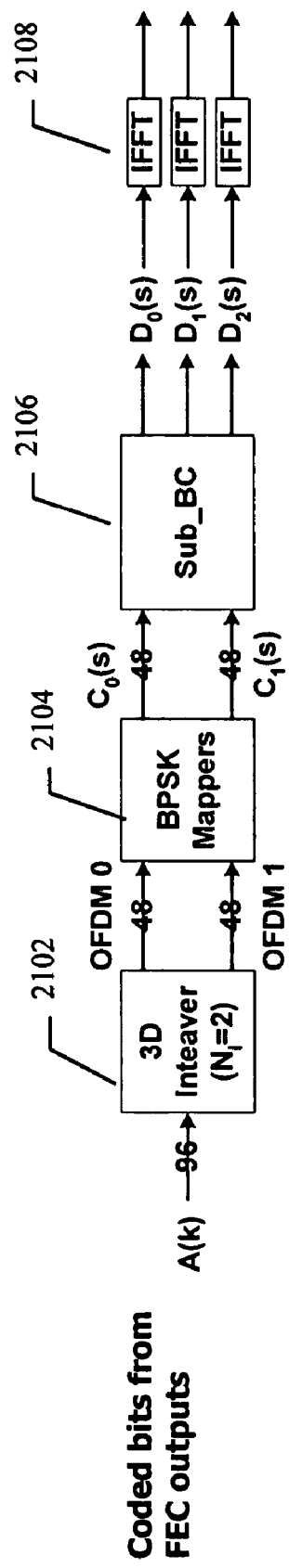
FIG. 21a is a schematic diagram of a Sub_BC 2(3) Circular SMX system according to an embodiment of the present invention.

FIG. 21a is a schematic diagram of a Sub_BC 2 (3) Circular SMX system according to an embodiment of the present invention. Coded bits from a convolutional encoder are input to a 3D interleaver 2102. FIG. 21b is a table providing an exemplary interleaver mapping for interleaver 2102 according to an embodiment of the present invention. The interleaved bits are mapped to subcarriers by mapper 2104. In the exemplary embodiment illustrated in FIG. 21a, mapper 2104 is a BPSK mapper. In the embodiment illustrated in FIG. 21a, BPSK mapper outputs two OFDM symbols, $C_0(s)$ and $C_1(s)$, where s is the subcarrier index. Subcarrier based circulation is provided by circulation unit 2106. In the embodiment illustrated in FIG. 21a, circulation unit Sub_BC block 2106 circulates the two outputs of BPSK mapper 2104 into three sets of IFFT inputs, i.e., $D_0(s)$, $D_1(s)$, and $D_2(s)$. The outputs of three IFFTs represent the OFDM symbols to be transmitted simultaneously.

For each subcarrier #s, the Sub_BC block may take two BPSK mapped samples, i.e., $C_0(s)$ and $C_1(s)$, as input and output them to one selected pattern shown in FIG. 19a. The selected pattern, P(s), which is a function of subcarrier index s, is defined in following equation:

$$P(s) = [\text{floor}(s/N_{carrier}) + (s \bmod N_{carrier})] \bmod N_{Pattern} \qquad (7)$$

where s=0, 1, 2, . . . , $N_{SC}$–1, and floor(x) is the largest integer smaller than or equal to x.

FIG. 21c is a table providing exemplary Sub_BC circulations patterns for each subcarrier#s according to an embodiment of the present invention. As shown in FIG. 21c, each selected pattern only specifies two numbers, i.e., only two ($N_{OFDM}$=2) non-zero inputs for the subcarrier #s of the three (M=3) IFFTs, $D_0(s)$, $D_1(s)$, and $D_2(s)$. In comparison, the S_BC takes $N_{OFDM}$ OFDM symbols and circulates them into M antennas (one of them is inactive) while the Sub_BC takes $N_{OFDM}$ QAM samples from each subcarrier and circulate them into M QAM samples (one of them is zero) for the same subcarrier of M OFDM symbols. FIG. 21d is a table illustrating separations according to the interleaving by an embodiment of the system illustrated in FIG. 21a. As shown in FIG. 21d, the three most important separations are still properly maintained if both 3D interleaver and Sub_BC are implemented.

The physical meaning of the above provided equation for P(s) is described as follows. Every $N_{carrier}$ subcarriers of all subcarriers are grouped and circulated into $N_{Pattern}$ circulation patterns which include all transmitter antennas. The first modulo operation provides an additional one-subcarrier shift in the next group of $N_{carrier}$ subcarriers. Here the number of subcarriers in a group, $N_{carrier}$, is a design parameter. $N_{carrier}$ is chosen to be 3 in the example described above to ensure a three subcarrier separation.

Figure 22A:
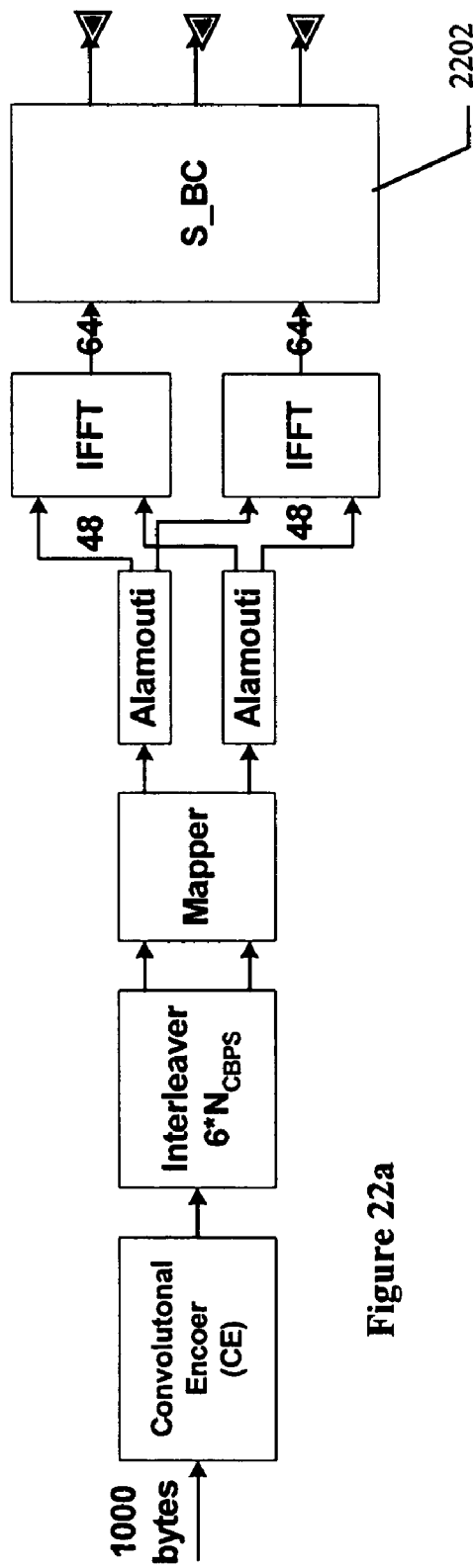
FIG. 22a is a schematic diagram of a 2(3) S_BC MIMO system using an Alamouti code according to an embodiment of the present invention.
Figure 22B:
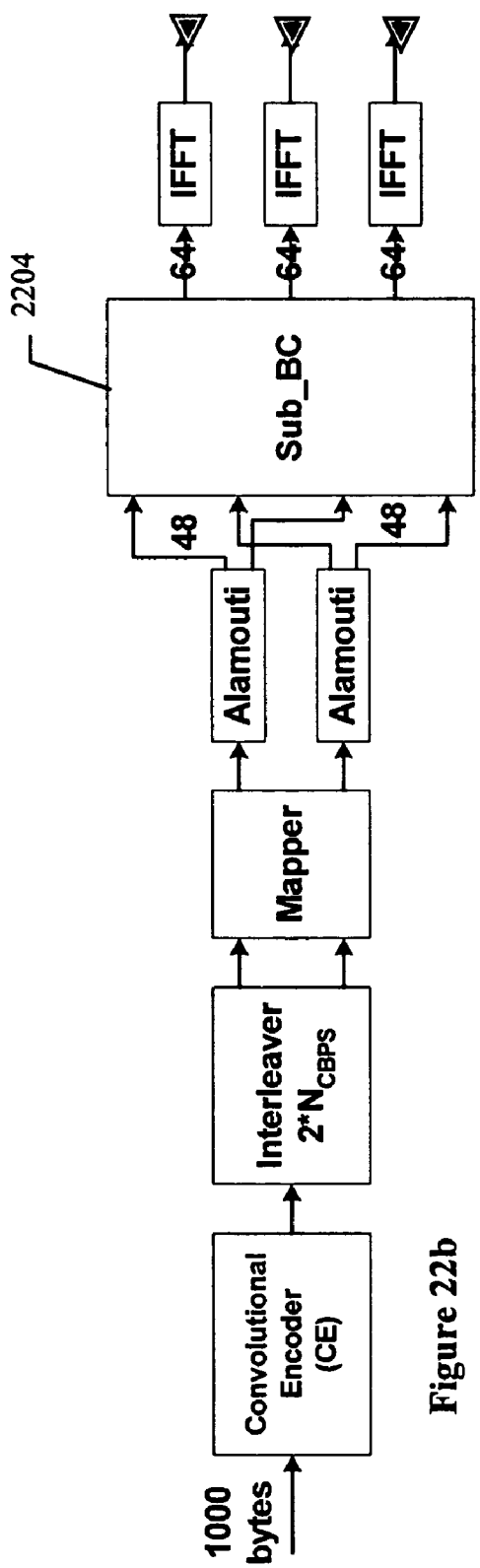
FIG. 22b is a schematic diagram of a 2(3) Sub_BC MIMO system using a Circular Alamouti code according to an embodiment of the present invention.

Both S_BC and Sub_BC can be applied to various space time block codes (STBC) when the number of simultaneously transmitted OFDM symbols is less than the number of total transmitter antennas. One well-known such STBC is known as the Alamouti Code (ALA) FIG. 22a is a schematic diagram of a 2(3) S_BC MIMO system using an Alamouti code according to an embodiment of the present invention. FIG. 22b is a schematic diagram of a 2(3) Sub_BC MIMO system using an Alamouti according to an embodiment of the present invention. As shown in FIGS. 22a-b, two OFDM symbols are transmitted simultaneously from the circulation units. In FIG. 22a, circulation is provided by S_BC circulation unit 2202. In FIG. 22b, circulation is provided by Sub_BC circulation unit 2204. FIG. 23a is a table comprising circulation patterns that can be employed by circulation units 2202 and 2204 according to preferred embodiments of the present invention. FIG. 23b is a table providing interleaver sizes that can be employed according to embodiments of the present invention.

The following relationships are applicable to the Circulation Transmission Alamouti code (hereafter referred to as CALA) system illustrated in FIGS. 22a-b and 23a-b:

$$N_{Pattern} = \binom{M}{N_{OFDM}}$$

= Number of circulation patterns for both S_BC and sub_BC $N_I = N_{OFDM} \cdot N_{Pattern}$ for CALA systems with S_BC $N_I = N_{OFDM}$ for CALA systems with sub_BC Note that bigger $N_I$ implies a larger hardware size and longer coding delay. It can be seen that both the interleaver size and circulation patterns are the same as a Circular SMX or Circular Alamouti code MIMO system. Other STBC MIMO systems (not Alamouti codes) have M antennas and transmit a smaller number, $N_{OFDM}$ OFDM symbols simultaneously can use either S_BC or Sub_BC.

In summary, a subcarrier-based circulation transmission (Sub_BC) according to one embodiment of the present invention can be summarized with reference to FIGS. 19a-b and 23a-b. A MIMO system with M transmitter antennas is simultaneously transmits $N_{OFDM}$ OFDM symbols. The input for each subcarrier of an OFDM symbol is one QAM (mapped) sample. Each OFDM symbol contains $N_{SC}$ subcarriers with index s=0, 1, 2..., $N_{SC}-1$. The proposed Sub_BC transforms the inputs for $N_{OFDM}$ OFDM symbols (denoted as $C_0$, $C_1$, ..., $C_{N_{OFDM}-1}$) into inputs for M OFDM ($N_{OFDM}<M$) symbols (denoted as $D_0, D_1, \ldots, D_{M-1}$), examples of which are described below.

For each subcarrier s, $N_{OFDM}$ QAM samples are taken from $N_{OFDM}$ OFDM symbols, i.e., one QAM sample is taken from the same subcarrier s from each of the $N_{OFDM}$ OFDM symbols C's. However, M QAM samples are required for M OFDM symbols D's for the same subcarrier s. These $N_{OFDM}$ QAM samples for subcarrier s from OFDM symbols C's are mapped into the $N_{OFDM}$ (out of total M) OFDM symbols D's for the same subcarrier s. In other words, there are M QAM samples for the subcarrier s of M OFDM symbols D's, where $N_{OFDM}$ QAM samples are from OFDM symbols C's of the same subcarrier s and the rest $(M-N_{OFDM})$ QAM samples are zeros.

The mapping from $N_{OFDM}$ QAM samples of OFDM symbols C's to $N_{OFDM}$ QAM samples of OFDM symbols D's is according to a selected Pattern# defined in FIG. 19a. The selected Pattern#, P(s), is determined by the following equation $$P(s) = s \bmod N_{Pattern} \quad (8)$$

where s=0, 1, 2, ..., $N_{SC}-1$, is the subcarrier index.

In other words, for each subcarrier s, a selected P(s) is determined from Equation (8). The selected P(s) specifies $N_{OFDM}$ different numbers out of M numbers (from 0, 1, 2, ..., M-1) corresponding to M OFDM symbols D's. The $N_{OFDM}$ QAM samples from OFDM symbols C's are mapped into the specified $N_{OFDM}$ OFDM symbols D's according to the selected P(s) for each subcarrier s. The subcarrier s of $(M-N_{OFDM})$ OFDM symbols D's are zeros if their OFDM numbers are not specified in the specified P(s). After finishing the mapping for all subcarriers, (s=0, 1, 2, ..., $N_{SC}-1$), M new OFDM symbols D's are constructed from the $N_{OFDM}$ OFDM symbols C's.

The number of all possible patterns, $N_{Pattern}$, for an $N_{OFDM}$ (M) system is given by $$N_{Pattern} = \binom{M}{N_{OFDM}} = \frac{M!}{N_{OFDM}!(M-N_{OFDM})!} \quad (9)$$

The selected P(s) is a periodic number from 0 to $N_{Pattern}-1$ due to the modulo $N_{Pattern}$ operation in Equation (8). A complete set of patterns includes all possible patterns, Pattern#0, #1, ..., #$N_{Pattern}-1$. After a complete set of patterns, equal numbers of non-zero and zero subcarriers are uniformly distributed to each OFDM symbol D's in an $N_{OFDM}$ (M) MIMO system. The selected pattern number P(s) is periodically repeated from 0 to $N_{Pattern}-1$ ... For example, if $N_{Pattern}=3$, the P(s)=0, 1, 2, 0, 1, 2, ..., 0, 1, 2, ... for subcarrier index s=0, 1, 2, 3, 4, 5, ....

A modification of Equation (8) is given as follows

Pattern(s)=[floor(s/$N_{carrier}$)+(s mod $N_{carrier}$)] mod $N_{Pattern}$ (10)

In Equation (10), s is the subcarrier index and $N_{carrier}$ is a design parameter. According to Equation (10), every $N_{carrier}$ subcarriers is a group. The selected pattern is periodically repeated from 0 to $N_{Pattern}-1$ but with one additional pattern shift from one group to the next group of subcarriers. For example, if $N_{carrier}=3$ and $N_{Pattern}=3$, three subcarriers are in a group and the periodic pattern numbers P(s) are 0, 1, and 2. If the Equation (10) is applied, the shifted periodic patterns becomes P(s)=0, 1, 2, 1, 2, 0, 2, 0, 1, ..., for subcarrier index s=0, 1, 2, 3, 4, 5, 6, 7, 8, .... It is observed that one additional pattern number may shift every three subcarriers.

In other embodiments of the present invention, variations to the scheme described above are implemented. For example, such alternative embodiments of the present invention may include one or more of the following implementations:

(I) An arbitrary number of pattern shifts in every $N_{carrier}$ subcarriers. The pattern shift is one in Equation (7) and can have arbitrary value from 0 to $N_{Pattern}-1$.

(II) A periodic pattern numbers including a complete set or a partial set of all possible $N_{Pattern}$ patterns. For example, for a 2(4) MIMO system, $N_{Pattern}$ is six or Patterns#0, #1, #2, ..., #5. For example, according to one embodiment of the present invention, the partial set of the patterns is #0, #1, and #2 only. A partial set of a complete set includes a smaller number of patterns from total $N_{Pattern}$ patterns. A modification based on Equations (7), (8) and (10) is given as follows:

Pattern(s)=[$N_{shift}$×floor(s/$N_{carrier}$)+$N_{offset}$×(s mod $N_{carrier}$)] mod $N_{Partial}$ (11)

where $N_{shift}$ defines the shift in pattern number, $N_{offset}$ is the offset of subcarriers, and $N_{Partial}$ indicates that a set of periodic patterns includes a partial or all patterns from all possible patterns.

(III) Transformation of $N_{OFDM}$ OFDM symbols C's into M OFDM symbols D's "evenly" such that the total numbers of non-zero subcarriers for all C's and for all D's are the same. In addition to (III) the number of non-zero subcarriers in each OFDM D's is the same.

The foregoing disclosure of the examples of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure.

What is claimed is:

1. A three-Dimensional (3D) interleaver for interleaving an input stream in an Orthogonal-Frequency-Division-Multiplexing (OFDM) based Multiple-Input-Multiple-Output (MIMO) system, the 3D interleaver configured to:
   receive an input bit stream A(k), k=0, 1, 2, . . . , $N_{CBPS} \times N_I - 1$, where $N_{CBPS}$ is the number of input bits per OFDM symbol, $N_I$ is the number of OFDM symbols per 3D interleaver;
   select two parameters $N_{row}$ and $N_{column}$, where $N_{row} \times N_{column} = N_{CBPS}$;
   form a 3D structure, the 3D structure having $N_I \times N_{row} \times N_{column}$ empty cells, dimensions of the 3D structure being $N_I$, $N_{row}$ and $N_{column}$ respectively;
   write each input bit A(k) to each cell of the 3D structure, position of each cell in the 3D structure being defined by three co-ordinates, x, y, and z, where $0 \le x \le N_{column}-1$, $0 \le y \le N_I-1$, and $0 \le z \le N_{row}-1$;
   interleave the input bit stream A(k), k=0, 1, 2, . . . , $N_{CBPS} \times N_I - 1$ into $N_I$ groups of cells in a 3D structure, each group being associated with one OFDM symbol, wherein consecutive input bits are assigned to different groups of cells to allow for the two consecutive input bits to be transmitted in different OFDM symbols; and
   output an interleaved bit stream B(j), j=0, 1, 2, . . . , $N_{CBPS} \times N_I - 1$, from the 3D structure.

2. The 3D interleaver of claim 1, wherein each input bit A(k) is randomly written into one empty cell of the 3D structure.

3. The 3D interleaver of claim 1, wherein each interleaved bit B(j) is randomly read from the 3D structure, each cell being read only once.

4. The 3D interleaver of claim 1, wherein a first input bit A(m) and a second input bit A(n) are modulated to the same subcarrier of different OFDM symbols, the first input bit A(m) and the second input bit A(n) having a separation of at least $N_{column}$ bits, where m,n=0, 1, 2, . . . , $N_{CBPS} \times N_I - 1$.

5. The 3D interleaver of claim 1, wherein two consecutive input bits A(k) and A(k+1) are modulated to a first subcarrier and a second subcarrier respectively, the first and the second subcarriers being in different OFDM symbols and having at least a separation of $N_{SCPC}$ subcarriers, where $N_{SCPC} = N_{row}/N_{BPSC}$, and $N_{BPSC}$ is the number of bits per subcarrier.

6. The 3D interleaver of claim 1, wherein a first input bit A(i) and a second input bit A(j) are modulated to two consecutive subcarriers of the same OFDM symbol, the first encoded bit A(i) and the second encoded bit A(j) having a separation of at least $N_I \times N_{column}$ bits.

7. The 3D interleaver of claim 1, wherein the three co-ordinates x, y, z of the 3D structure are represented by the following equations:

$$x = k \bmod(N_{column});$$
$$y = \text{floor}\left(\frac{k}{N_{column}}\right) \bmod(N_I);$$
$$z = \text{floor}\left[\left(\frac{k}{N_{column} N_I}\right)\right]$$

and the interleaved bit stream B(j) is obtained according to the following equation:

$$j = z + x \cdot \left(\frac{(N_{CBPS})}{N_{column}}\right) + N_{CBPS} \cdot ((y-x) \bmod(N_I))$$

where $j = 0, 1, 2, \ldots, N_{CBPS} \times N_I - 1$.

8. The 3D interleaver of claim 1, wherein the three co-ordinates x, y, z of the 3D structure are represented by the following equations:

$$x = k \bmod(N_{column});$$
$$y = \text{floor}\left(\frac{k}{N_{column}}\right) \bmod(N_I);$$
$$z = \text{floor}\left[\left(\frac{k}{N_{column} N_I}\right)\right]$$

and the interleaved bit stream B(j) is obtained according to the following equation:

$$i = z + x \cdot \left(\frac{N_{CBPS}}{N_{column}}\right) + N_{CBPS} \cdot ((y-x) \bmod(N_I));$$

$$j = N_{CBPS}\left[\text{floor}\left(\frac{i}{N_{CBPS}}\right)\right] + s \cdot \left[\text{floor}\left(\frac{i \bmod (N_{CBPS})}{s}\right)\right] + \left[(i \bmod(N_{CBPS})) + N_{CBPS} - \text{floor}\left\{\frac{N_{column} \cdot (i \bmod (N_{CBPS}))}{N_{CBPS}}\right\}\right] \bmod(s) \text{ where } s =$$

$$\max(N_{BPSC}/2, 1), i, j = 0, 1, \ldots, N_{CBPS} \times N_I - 1.$$

9. The 3D interleaver of claim 1, wherein the three co-ordinates x, y, z of the 3D structure are represented by the following equations:

$$j = N_{CBPS}\left[\text{floor}\left(\frac{i}{N_{CBPS}}\right)\right] + s \cdot \left[\text{floor}\left(\frac{i \bmod (N_{CBPS})}{s}\right)\right] + \left[(i \bmod(N_{CBPS})) + N_{CBPS} - \text{floor}\left\{\frac{N_{column} \cdot (i \bmod (N_{CBPS}))}{N_{CBPS}}\right\}\right] \bmod(s) \text{ where } s =$$

$$\max(N_{BPSC}/2, 1), i, j = 0, 1, \ldots, N_{CBPS} \times N_I - 1.$$

and the interleaved bit stream B(j) is obtained according to the following equation:

$$j = z + x \cdot \left(\frac{(N_{CBPS})}{N_{column}}\right) + N_{CBPS} \cdot ((y-x) \bmod(N_I))$$

where $j = 0, 1, 2, \ldots, N_{CBPS} \times N_I - 1$.

10. The 3D interleaver of claim 1, wherein the three co-ordinates x, y, z of the 3D structure are represented by the following equations:

$$x = k \bmod(N_{column});$$
$$y = \text{floor}\left(\frac{k}{N_{column}}\right) \bmod(N_I);$$
$$z = \text{floor}\left[\left(\frac{k}{N_{column} N_I}\right) + y \cdot N_{BPSC}\right] \bmod\left(\frac{N_{CBPS}}{N_{column}}\right);$$

and the interleaved bit stream B(j) is obtained according to the following equation:

$$i = z + x \cdot \left(\frac{N_{CBPS}}{N_{column}}\right) + N_{CBPS} \cdot ((y-x) \bmod(N_I));$$

$$j = N_{CBPS}\left[\text{floor}\left(\frac{i}{N_{CBPS}}\right)\right] + s \cdot \left[\text{floor}\left(\frac{i \bmod (N_{CBPS})}{s}\right)\right] + \left[(i \bmod(N_{CBPS})) + N_{CBPS} - \text{floor}\left\{\frac{N_{column} \ (i \bmod (N_{CBPS}))}{N_{CBPS}}\right\}\right] \bmod(s) \text{ where } s =$$

$$\max(N_{BPSC}/2, 1), \ i, j = 0, 1, \ldots, N_{CBPS} \times N_I - 1.$$

11. The 3D interleaver of claim 1, wherein the 3D structure comprises a 3D block.

12. A method for interleaving a plurality of input data bits in an Orthogonal-Frequency-Division-Multiplexing (OFDM) based Multiple-input-multiple-output (MIMO) system, the method comprising:
  receiving an input bit stream;
  writing the received input bit stream to a 3D structure;
  selecting three parameters $N_I$, $N_{row}$ and $N_{column}$, where $N_{row} \times N_{column} = N_{CBPS}$, $N_{CBPS}$ is the number of input bits per OFDM symbol, $N_I$ is the number of OFDM symbols per 3D interleaver;
  interleaving the input bit stream to generate a corresponding interleaved bit stream; and
  outputting the interleaved bit stream from the 3D structure, wherein two consecutive input bits of the input bit stream are transmitted in different OFDM symbols simultaneously.

13. The method of claim 12 further comprising forming the 3D structure, the 3D structure having $N_I \times N_{row} \times N_{column}$ empty positions, dimensions of the 3D structure being $N_I$, $N_{row}$ and $N_{column}$ respectively.

14. The method of claim 13 further comprising writing each input bit to each position of the 3D structure, the position of each input bit in the 3D structure being defined by three co-ordinates, x, y, and z, where $0 \leq x \leq N_{column}-1$, $0 \leq y \leq N_I-1$, and $0 \leq z \leq N_{row}-1$.

* * * * *